United States Patent
Melanson

[11] Patent Number: 5,815,102
[45] Date of Patent: Sep. 29, 1998

[54] DELTA SIGMA PWM DAC TO REDUCE SWITCHING

[75] Inventor: John Laurence Melanson, Boulder, Colo.

[73] Assignee: AudioLogic, Incorporated, Boulder, Colo.

[21] Appl. No.: 662,873

[22] Filed: Jun. 12, 1996

[51] Int. Cl.[6] .................................................. H03M 3/00
[52] U.S. Cl. ........................................ 341/143; 341/152
[58] Field of Search ................................. 341/152, 143, 341/144, 131, 77, 53

[56] References Cited

U.S. PATENT DOCUMENTS

| | | | |
|---|---|---|---|
| 4,592,087 | 5/1986 | Killion | 381/68 |
| 4,876,542 | 10/1989 | van Bavel et al. | 341/143 |
| 4,977,403 | 12/1990 | Larson | 341/143 |
| 5,008,675 | 4/1991 | Toyomaki | 341/152 |
| 5,014,016 | 5/1991 | Anderson | 330/10 |
| 5,148,168 | 9/1992 | Masuda et al. | 341/152 |
| 5,245,345 | 9/1993 | Kohdaka et al. | 341/152 |
| 5,247,581 | 9/1993 | Gurcan | 381/68.4 |
| 5,252,973 | 10/1993 | Masuda | 341/131 |
| 5,389,829 | 2/1995 | Milazzo | 327/172 |
| 5,406,284 | 4/1995 | Lin et al. | 341/144 |

*Primary Examiner*—Howard L. Williams
*Attorney, Agent, or Firm*—Jennifer L. Bales; Macheledt Bales & Johnson LLP

[57] ABSTRACT

A digital to analog (D/A) converter for hearing aids and the like includes a delta sigma modulator and a duty cycle demodulator. The delta sigma modulator converts medium rate, high resolution data into medium rate, medium resolution data, and the duty cycle demodulator converts the medium rate, medium resolution data into low resolution, high rate data. The duty cycle demodulator utilizes a lookup function to format the output data in a format having lowered transition rates, resulting in lower power use. The delta sigma converter may include a correction factor in at least one of its feedback loops to compensate for the characteristics of the output data from the duty cycle demodulator.

26 Claims, 25 Drawing Sheets

```
/******************************************************************
 *                                                                 *
 * C program to simulate a noise shaped, PWM digital to analog converter *
 *                                                                 *
 * John Melanson, 20 May 1996                                      *
 * Assumes an input signal, 16 bit signed integer,                 *
 * with +-16*1024 being the input saturation points                *
 *                                                                 *
 * The PWM output is operating at 16 times the noise shaping grequency. *
 *                                                                 *
 * Uses a noise shaper than can be built with one 3 port adder     *
 * (two 16 bit inputs, one 10 bit input),                          *
 * and operated in three phases.                                   *
 *                                                                 *
 * The delta sigma structure used is especially appropriate,       *
 * as it operates in three phases, and is very                     *
 * stingy on hardware resources                                    *
 *                                                                 *
 *                                                                 *
 * The converter is assuemd to be operating at a 250 kHz noise shaped rate, *
 * and at a 4 MHz output bit rate                                  *
 *                                                                 *
 ******************************************************************/
#include <stdio.h>
include <math.h> double fs = 250000.;

// Feedback of quantized output short fb[17] = {
    0x4000,   // 0
    0x3800,   // 1
    0x3000,   // 2
    0x2800,   // 3
    0x2000,   // 4
    0x1800,   // 5
    0x1000,   // 6
    0x0800,   // 7
    0x0000,   // 8
    0xf800,   // 9
    0xf000,   // 10
    0xe800,   // 11
    0xe000,   // 12
    0xd800,   // 13
    0xd000,   // 14
    0xc800,   // 15
    0xc000    // 16
};

// Correction factor for second integral.  Note that the sign is opposite
// that of the feedback, as odd output widths are late relative to
// even output widths short cor[17] = {
    0x0000,   // 0
    0x0040,   // 1
    0x0000,   // 2
    0x00c0,   // 3
    0x0000,   // 4
    0x0140,   // 5
    0x0000,   // 6
    0x01c0,   // 7
    0x0000,   // 8
    0x0240,   // 9
```

// Rom for duty cycle modulator - pulse
// grows from middle, on right first
// short out_rom[17][16] = {
    { -1, -1, -1, -1, -1, -1, -1, -1, -1, -1, -1, -1, -1, -1, -1, -1 },  //0
    { -1, -1, -1, -1, -1, -1, -1, -1, +1, -1, -1, -1, -1, -1, -1, -1 },  //1
    { -1, -1, -1, -1, -1, -1, -1, +1, +1, -1, -1, -1, -1, -1, -1, -1 },  //2
    { -1, -1, -1, -1, -1, -1, -1, +1, +1, +1, -1, -1, -1, -1, -1, -1 },  //3
    { -1, -1, -1, -1, -1, -1, +1, +1, +1, +1, -1, -1, -1, -1, -1, -1 },  //4
    { -1, -1, -1, -1, -1, -1, +1, +1, +1, +1, +1, -1, -1, -1, -1, -1 },  //5
    { -1, -1, -1, -1, -1, +1, +1, +1, +1, +1, +1, -1, -1, -1, -1, -1 },  //6
    { -1, -1, -1, -1, -1, +1, +1, +1, +1, +1, +1, +1, -1, -1, -1, -1 },  //7
    { -1, -1, -1, -1, +1, +1, +1, +1, +1, +1, +1, +1, -1, -1, -1, -1 },  //8
    { -1, -1, -1, -1, +1, +1, +1, +1, +1, +1, +1, +1, +1, -1, -1, -1 },  //9
    { -1, -1, -1, +1, +1, +1, +1, +1, +1, +1, +1, +1, +1, -1, -1, -1 },  //10
    { -1, -1, -1, +1, +1, +1, +1, +1, +1, +1, +1, +1, +1, +1, -1, -1 },  //11
    { -1, -1, +1, +1, +1, +1, +1, +1, +1, +1, +1, +1, +1, +1, -1, -1 },  //12
    { -1, -1, +1, +1, +1, +1, +1, +1, +1, +1, +1, +1, +1, +1, +1, -1 },  //13
    { -1, +1, +1, +1, +1, +1, +1, +1, +1, +1, +1, +1, +1, +1, +1, -1 },  //14
    { -1, +1, +1, +1, +1, +1, +1, +1, +1, +1, +1, +1, +1, +1, +1, +1 },  //15
    { +1, +1, +1, +1, +1, +1, +1, +1, +1, +1, +1, +1, +1, +1, +1, +1 }   //16
};

/****************************************************************************
 *                                                                          *
 *                      add_3                                               *
 *                                                                          *
 * Emulate a 3 input, 16 bit adder (the third input, c,                     *
 * needs to be only 10 bits).                                               *
 * The adder saturates on overflow and underflow                            *
 *                                                                          *
 ****************************************************************************/ short add_3(short a, short b, short c){
    long temp = (long)a + long(b) + long(c);
    if (temp > (signed)0x00007fffL) return 0x7fff;
    if (temp < (signed)0xffff8000L) return 0x8000;
    return (short) temp;
}

/****************************************************************************
 *                                                                          *
 *                      quant                                               *
 *                                                                          *
 * Quantize a 16 bit value to a number in the range 0 - 16.  Over and       *
 * underflows will produce values of 16 and 0, respectivly.  A 0 input      *
 * produces an 8 output, which corrosponds to a 50% duty cycle              *
 *                                                                          *
 ****************************************************************************/ short quant(short x){
    if (x >= (signed short) 0x4000) return 16;
```

FIGURE 17B

```
    if (x <= (signed short) 0xc000) return 0;
    return (x + 0x4000) >> 11;
}

/*****************************************************************************
 *                                                                           *
 *                       insig                                               *
 *                                                                           *
 * Make a test signal, 2 kHz, +- 10000 amplitude. This function              *
 * would normally be replaced by a signal source                             *
 * followed by some kind of sample rate increasing system.                   *
 *                                                                           *
 *                                                                           *
 *****************************************************************************/ define testfreq 2000.
define level 10000.

short insig( long time){
    return (short)(.5 + level * sin(2 * 3.14159 / fs * testfreq * (long)time));
}

/*****************************************************************************
 *                                                                           *
 *                       bias                                                *
 *                                                                           *
 * The output of this routine could be a simple 0x0400, but better           *
 * results are had with a little bit of white noise injected.                *
 * White noise comes from a randome prn                                      *
 *                                                                           *
 *                                                                           *
 *****************************************************************************/ short bias(void){
    static short r = 1;
    r = (r << 1) | (1 & ((r>>14)^(r>>13)) );
//
// return 0x300,0x340,0x380 ... 0x6c0
//
    return (r & 0x3c0) + 0x300;
}

/*****************************************************************************
 *                                                                           *
 *                       main                                                *
 *                                                                           *
 * Emulate converter                                                         *
 * Test will run for 500 us, one cycle of the test sine wave                 *
 *                                                                           *
 *                                                                           *
 * The three ports of the adder are connected as follows                     *
 * port       phase 0      phase 1      phase 2                              *
 * a          r0           r0           r0          (hard wired)             *
 * b          input        r1           r1          (requires a 2 input mux) *
 * c          feedback     correction   bias        (requires simple logic)  *
 *                                                                           *
 *****************************************************************************/ void main(void){
    short r0 = 0;    // one of the hardware integrations registers
    short r1 = 0;    // the other hardware integration register
    short out = 8;   // the previous output duty cycle
```

FIGURE 17C

```
    long time;
    FILE *results;

/* open an output file for update */
    results = fopen("DAC.OUT", "w+");
    fprintf(results,"Output results of DAC simulation - 4MHz rate\n");

for ( time = 0; time < 125; time ++){

//
// Do delta - sigma part
// r0  =       add_3( r0 , insig(time) , fb[out]  );      // phase 0
        r1  =       add_3( r0 , r1          , cor[out] );      // phase 1
        out = quant( add_3( r0 , r1         , bias()   ) );    // phase 2

//
// Now do duty cycle modulator
// for(int tick = 0; tick < 16; tick++){
            fprintf (results,"%+4d",out_rom[out][tick]);
        }
        fprintf(results,"\n");
    }
    fclose(results);
}
```

FIGURE 17D

```
Output results of DAC simulation - 4MHz rate
 -1  -1  -1  -1  +1  +1  +1  +1  +1  +1  +1  +1  -1  -1  -1  -1
 -1  -1  -1  -1  +1  +1  +1  +1  +1  +1  +1  +1  -1  -1  -1  -1
 -1  -1  -1  +1  +1  +1  +1  +1  +1  +1  +1  +1  +1  -1  -1  -1
 -1  -1  -1  -1  +1  +1  +1  +1  +1  +1  +1  +1  -1  -1  -1  -1
 -1  -1  -1  -1  +1  +1  +1  +1  +1  +1  +1  +1  -1  -1  -1  -1
 -1  -1  -1  +1  +1  +1  +1  +1  +1  +1  +1  +1  -1  -1  -1  -1
 -1  -1  -1  +1  +1  +1  +1  +1  +1  +1  +1  +1  -1  -1  -1  -1
 -1  -1  -1  +1  +1  +1  +1  +1  +1  +1  +1  +1  -1  -1  -1  -1
 -1  -1  -1  -1  +1  +1  +1  +1  +1  +1  +1  +1  -1  -1  -1  -1
 -1  -1  -1  +1  +1  +1  +1  +1  +1  +1  +1  +1  +1  -1  -1  -1
 -1  -1  -1  +1  +1  +1  +1  +1  +1  +1  +1  +1  +1  -1  -1  -1
 -1  -1  -1  +1  +1  +1  +1  +1  +1  +1  +1  +1  +1  -1  -1  -1
 -1  -1  -1  +1  +1  +1  +1  +1  +1  +1  +1  +1  -1  -1  -1  -1
 -1  -1  +1  +1  +1  +1  +1  +1  +1  +1  +1  +1  +1  -1  -1  -1
 -1  -1  -1  +1  +1  +1  +1  +1  +1  +1  +1  +1  +1  -1  -1  -1
 -1  -1  -1  +1  +1  +1  +1  +1  +1  +1  +1  +1  +1  -1  -1  -1
 -1  -1  +1  +1  +1  +1  +1  +1  +1  +1  +1  +1  +1  +1  -1  -1
 -1  -1  -1  +1  +1  +1  +1  +1  +1  +1  +1  +1  +1  -1  -1  -1
 -1  -1  +1  +1  +1  +1  +1  +1  +1  +1  +1  +1  +1  -1  -1  -1
 -1  -1  +1  +1  +1  +1  +1  +1  +1  +1  +1  +1  +1  -1  -1  -1
 -1  -1  +1  +1  +1  +1  +1  +1  +1  +1  +1  +1  +1  +1  -1  -1
 -1  -1  +1  +1  +1  +1  +1  +1  +1  +1  +1  +1  +1  -1  -1  -1
 -1  -1  +1  +1  +1  +1  +1  +1  +1  +1  +1  +1  +1  -1  -1  -1
 -1  -1  +1  +1  +1  +1  +1  +1  +1  +1  +1  +1  +1  +1  -1  -1
 -1  -1  +1  +1  +1  +1  +1  +1  +1  +1  +1  +1  +1  -1  -1  -1
 -1  -1  +1  +1  +1  +1  +1  +1  +1  +1  +1  +1  +1  +1  -1  -1
 -1  -1  +1  +1  +1  +1  +1  +1  +1  +1  +1  +1  +1  +1  -1  -1
 -1  +1  +1  +1  +1  +1  +1  +1  +1  +1  +1  +1  +1  +1  -1  -1
 -1  -1  -1  +1  +1  +1  +1  +1  +1  +1  +1  +1  +1  -1  -1  -1
 -1  +1  +1  +1  +1  +1  +1  +1  +1  +1  +1  +1  +1  +1  -1  -1
 -1  -1  +1  +1  +1  +1  +1  +1  +1  +1  +1  +1  +1  -1  -1  -1
 -1  -1  +1  +1  +1  +1  +1  +1  +1  +1  +1  +1  +1  +1  -1  -1
 -1  +1  +1  +1  +1  +1  +1  +1  +1  +1  +1  +1  +1  +1  -1  -1
 -1  -1  +1  +1  +1  +1  +1  +1  +1  +1  +1  +1  +1  -1  -1  -1
 -1  -1  +1  +1  +1  +1  +1  +1  +1  +1  +1  +1  +1  +1  -1  -1
 -1  -1  +1  +1  +1  +1  +1  +1  +1  +1  +1  +1  +1  +1  -1  -1
 -1  -1  +1  +1  +1  +1  +1  +1  +1  +1  +1  +1  +1  +1  -1  -1
 -1  -1  +1  +1  +1  +1  +1  +1  +1  +1  +1  +1  +1  -1  -1  -1
 -1  -1  +1  +1  +1  +1  +1  +1  +1  +1  +1  +1  +1  +1  -1  -1
 -1  -1  +1  +1  +1  +1  +1  +1  +1  +1  +1  +1  +1  -1  -1  -1
 -1  -1  +1  +1  +1  +1  +1  +1  +1  +1  +1  +1  +1  -1  -1  -1
 -1  -1  +1  +1  +1  +1  +1  +1  +1  +1  +1  +1  +1  +1  -1  -1
 -1  -1  -1  +1  +1  +1  +1  +1  +1  +1  +1  +1  +1  -1  -1  -1
 -1  -1  +1  +1  +1  +1  +1  +1  +1  +1  +1  +1  +1  +1  -1  -1
 -1  -1  -1  +1  +1  +1  +1  +1  +1  +1  +1  +1  +1  -1  -1  -1
 -1  -1  +1  +1  +1  +1  +1  +1  +1  +1  +1  +1  +1  -1  -1  -1
 -1  -1  -1  +1  +1  +1  +1  +1  +1  +1  +1  +1  +1  -1  -1  -1
 -1  -1  -1  +1  +1  +1  +1  +1  +1  +1  +1  +1  -1  -1  -1  -1
 -1  -1  +1  +1  +1  +1  +1  +1  +1  +1  +1  +1  +1  -1  -1  -1
 -1  -1  -1  -1  +1  +1  +1  +1  +1  +1  +1  +1  -1  -1  -1  -1
 -1  -1  -1  +1  +1  +1  +1  +1  +1  +1  +1  +1  +1  -1  -1  -1
 -1  -1  -1  +1  +1  +1  +1  +1  +1  +1  +1  +1  -1  -1  -1  -1
 -1  -1  -1  +1  +1  +1  +1  +1  +1  +1  +1  +1  +1  -1  -1  -1
 -1  -1  -1  -1  +1  +1  +1  +1  +1  +1  +1  +1  -1  -1  -1  -1
 -1  -1  -1  -1  +1  +1  +1  +1  +1  +1  +1  +1  -1  -1  -1  -1
 -1  -1  -1  -1  +1  +1  +1  +1  +1  +1  +1  +1  -1  -1  -1  -1
 -1  -1  -1  -1  +1  +1  +1  +1  +1  +1  +1  +1  -1  -1  -1  -1
 -1  -1  -1  -1  -1  +1  +1  +1  +1  +1  +1  +1  -1  -1  -1  -1
 -1  -1  -1  -1  +1  +1  +1  +1  +1  +1  +1  +1  +1  -1  -1  -1
```

DELTA SIGMA PWM DAC TO REDUCE SWITCHING

BACKGROUND OF THE INVENTION

1. Field of the Invention

The present invention relates to digital to analog (D/A) converters for audio frequencies.

2. Description of the Prior Art

Delta sigma modulation incorporates a noise-shaping technique whereby the noise of a quantizer (often 1-bit) operating at a frequency much greater than the bandwidth is moved to frequencies not of interest in the output signal. A filter after the quantizer removes the out of band noise. The resulting system synthesizes a high resolution data converter, but is constructed from low resolution building blocks. A good overview of the theory of delta sigma modulation is given in "Oversampling Delta-Sigma Data Converters," by Candy and Temes, IEEE Press, 1992.

FIG. 1 shows a well-known first order delta sigma quantizer. The purpose of this quantizer, in a digital to analog (D/A) converter, is to convert a high resolution digital signal xi, 11, having several bits (16, for example) into a single-bit code yi, 12, which can be accurately converted to analog. Input 11 is fed to the quantizer via an integrator 16, and quantized output 12 is fed back as feedback 25 and subtracted using adder 14 from the input. Integrator 16 comprises delay 18, and adder 17, which adds the delayed signal 19 to the signal from adder 14. Quantizer 21 acts as a 1-bit A/D converter, driving its output to a negative one (given a negative input), or a positive one (given a positive input). The quantizer function is modeled as adding the output of integrator 16 to an error signal ei, 23. This modeling allows the calculation of the spectrum of the noise to be done in a straight forward manner.

For large positive inputs, the integrator output will be positive. A logic one is then the output of the quantizer, which is fed back and subtracted from the input. The series of output ones continues until the integrator output, which is ramping down due to the negative feedback, finally crosses the quantizer threshold, when the quantizer outputs a negative one. Over time, the average output yi equals the input xi. The system is called a first order delta sigma converter, because a single integrator stage is used.

FIG. 2 shows how output yi, 31, looks for a sinusoidal input xi, 30. When the input sine wave is at a high level, a large number of ones are generated. When the input sine wave is at a low level, a large number of negative ones are generated.

FIG. 3 shows a common second order delta sigma quantizer. In practice, delta sigma modulators are generally at least second order, because higher order modulators better reduce noise in the signal band, due to improved prediction of the in-band quantization error. Thus, the resulting signal to noise ratio is better. Second order delta sigma modulators are still relatively stable, and easy to design.

Input xi, 35, is added to feedback signal 54 by adder 38. The signal from adder 38 is fed into first accumulator 40, comprising delay 42 and adder 41. The output of accumulator 40 is added to feedback signal 54 and fed into second accumulator 44, comprising delay 47, and adder 45. The output of accumulator 44 goes into quantizer 50, modeled as error signal ei, 52, added to the input by adder 51. Quantized output 36 also feeds back as feedback signal 54. Quantizer 50 may quantize the signal into ones and zeroes (1-bit format) or into multiple levels.

FIG. 4 shows an oversampling digital to analog (D/A) converter, which utilizes a second order delta sigma quantizer 70 and a one-bit D/A converter 71 as the demodulator 69, and a low pass filter 73 to remove the noise from the 1-bit signal. In one specific example of the oversampling D/A converter of FIG. 4, the input signal xi, 60, consists of data encoded into 16 bit words at 8 kHz. These words are placed into a register 63 from which they are fed into a low pass filter 64 at 32 kHz, with each word repeated four times. The low pass filter would typically by of the finite impulse response type. The linear interpolator 66, which is also a low pass filter, inserts three new words between each pair of words from low pass filter 64, which raises the data rate to 128 kHz. These words are fed into a second register 67, which feeds each word into the demodulator 69, repeating each word eight times, resulting in a data rate of 1 MHz. This repeating of the samples is a simple type of low pass filter. The 1 MHz sample rate is a sufficiently high data rate so that the quantization noise which will be introduced into the signal is small, and the requirements of the analog smoothing filter are easily met. Output yi, 61, is an analog signal.

Techniques for increasing the sample rate, generally called interpolation, are well understood by those versed in the art. Most designs will utilize several stages of increase, with each successive stage being simpler in structure, and running at a faster rate.

This sort of demodulator is frequently used in audio applications. The output of demodulator 69 can sometimes be driven directly into a speaker (not shown), because the speaker can act as a low pass filter. This configuration uses what is called class D output. Power dissipation in a class D stage has the potential for being very low, as the output transistors are always in either a fully shorted or open position, removing most resistive power consumption. The remaining power is dissipated by the switching of capacitance, which is equal to $C*V^2*F$. C, the capacitance being switched is typically set by the parasitic capacitance of the output transducer and of the driver transistors. V, the voltage being switched, is set by the available supplies, and the required audio output. F, the average frequency of the output, can be varied by the designer. As F is made larger, the quality of the signal improves, but the power also increases. Also, the calculations themselves require power dissipation.

An over-sampling digital to analog (D/A) converter like that of FIG. 4, which utilizes a second order delta sigma quantizer 70, and a low pass filter 71 to convert the data from the delta sigma quantizer 70 to analog signal yi, 61, is a very effective device. However, it has a relatively high output data transition rate, requiring higher power than is desirable.

European patent EP 0576 701 B1 shows a hearing aid having an A/D converter to convert the input sound to a digital format, conventional digital signal processing, and a pulse width modulator to convert the high resolution, low rate data into a low resolution, high rate class D output, meaning the digital bit stream drives an output transducer directly. The output of the pulse width modulator has relatively low transition rates, but since there is no noise shaping in the circuit, it has a low signal to noise ratio. An extremely high clock rate would be required to achieve good audio fidelity.

A need remains in the art for a D/A converter having lower power consumption due to a reduction in the number of output signal transitions, while maintaining low distortion.

SUMMARY OF THE INVENTION

An object of the present invention is to provide a digital to analog (D/A) converter having lower power consumption due to a reduction in the number of output signal transitions, while maintaining low distortion. Such a D/A converter is envisioned as especially useful for hearing aids of the type including an audio receiver to receive ambient sound, an analog to digital converter to convert the sound to a high resolution, low rate digital signal, digital processing circuitry to modify the quality of the high resolution, low rate digital signal, interpolator circuitry for converting the high resolution, medium rate digital signal to a medium rate, high resolution signal, and a digital to analog converter for converting the modified high resolution, medium rate digital signal back into analog sound.

The D/A converter converts a medium rate, high resolution digital signal into an analog signal, and includes a delta sigma modulator for converting the medium rate, high resolution digital signal into a medium rate, medium resolution digital signal, a duty cycle demodulator connected to the delta sigma modulator for converting the medium rate, medium resolution digital signal into a high rate, low resolution digital signal, and a D/A device connected to the duty cycle demodulator for converting the high rate, low resolution digital signal into the analog signal. The duty cycle demodulator formats the high rate, low resolution digital signal into a predetermined low transition rate format.

As a feature, the delta sigma modulator is at least a second order delta sigma modulator having at least two feedback loops carrying a feedback signal, and also selects and applies a correction factor (stored in ROM, for example) to at least one of the feedback loops based upon the predetermined low transition rate format and the feedback signal.

The duty cycle demodulator can include alternating means for alternating the predetermined low transition rate format between at least two different formats.

The delta sigma modulator may also be a higher than second order delta sigma modulator having more than two feedback loops carrying a feedback signal, and select and apply correction factors to more than one of the feedback loops based upon the predetermined low transition rate format and the feedback signal The duty cycle demodulator formats the high rate, low resolution digital signal into a predetermined low transition rate format by determining a multiple bit value corresponding to each input value of the medium rate, medium resolution digital signal and outputting the determined values as the high rate, low resolution digital signal. For example, the duty cycle demodulator might store a value corresponding each possible input value of the medium rate, medium resolution digital signal (in ROM, for example), and look up the corresponding stored value for each medium rate, medium resolution digital signal input. The duty cycle demodulator may utilize a parallel to serial converter connected to the ROM, for converting the parallel looked up values into the high rate, low resolution, low transition digital signal.

The D/A converter might have a class D output stage for driving an output speaker. Especially in the case of a hearing aid, it might be implemented in an integrated circuit, and operate at 1.1 volts or lower.

A single multiphase adder may comprise all of the accumulator arithmetic elements and the feedback arithmetic elements within the delta sigma modulator. For example, the single multiphase adder may comprise a three input adder operating in three phases. In this case, the first phase adds the input to the delta sigma modulator plus the previous output of the first stage plus the negative of the feedback, the second phase adds the current output of the first stage plus the previous output of the second stage, and the third phase adds the current output of the first stage plus the current output of the second stage, and feeds the quantizer.

BRIEF DESCRIPTION OF THE DRAWINGS

FIG. 7 is composed of FIGS. 7A through 7E, and shows several useful data formats for output from the duty cycle demodulator of FIG. 6.

FIGS. 17A–17F provides a C program simulation of the demodulator of FIG. 5, which utilizes the compensated delta sigma quantizer of FIG. 10.

DETAILED DESCRIPTION OF THE PREFERRED EMBODIMENT

Figure 4:
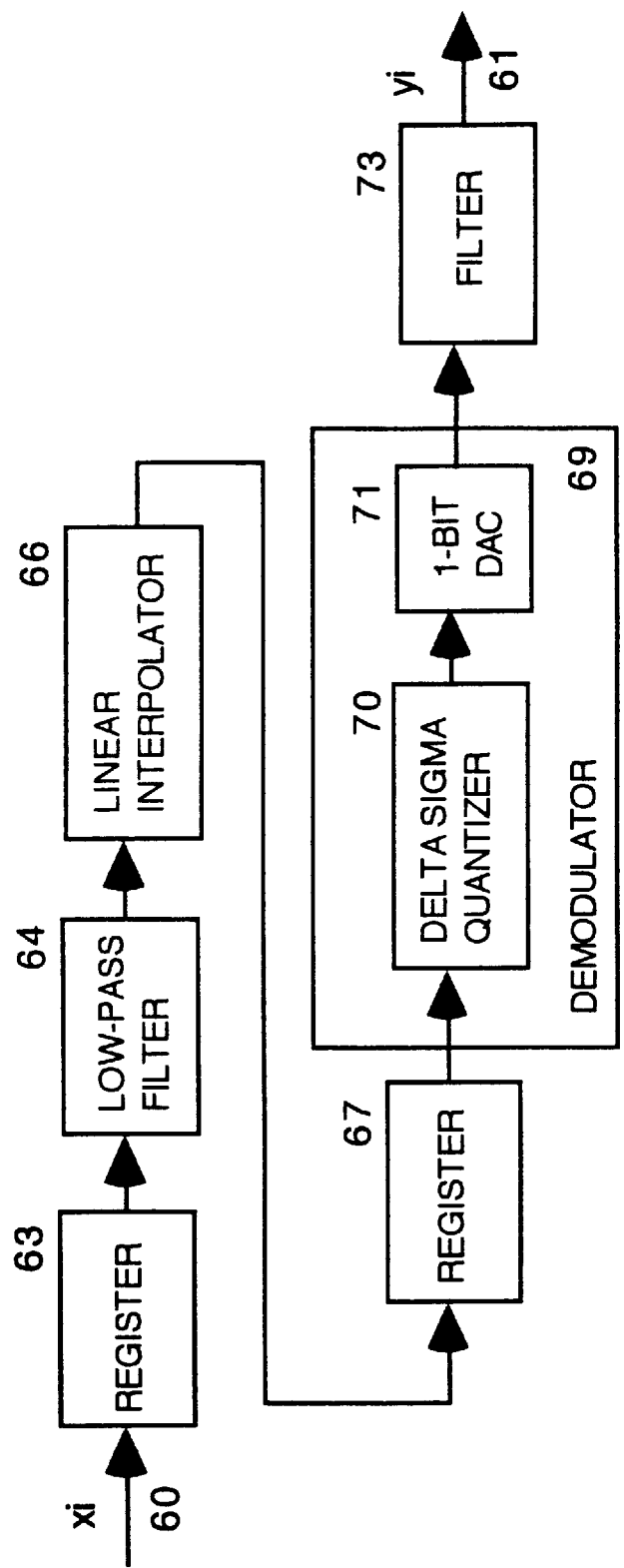
FIG. 4 (prior art) shows an over-sampling D/A converter system, which utilizes a second order delta sigma quantizer like that of FIG. 3, and a 1-bit D/A converter as the demodulator.
Figure 5:
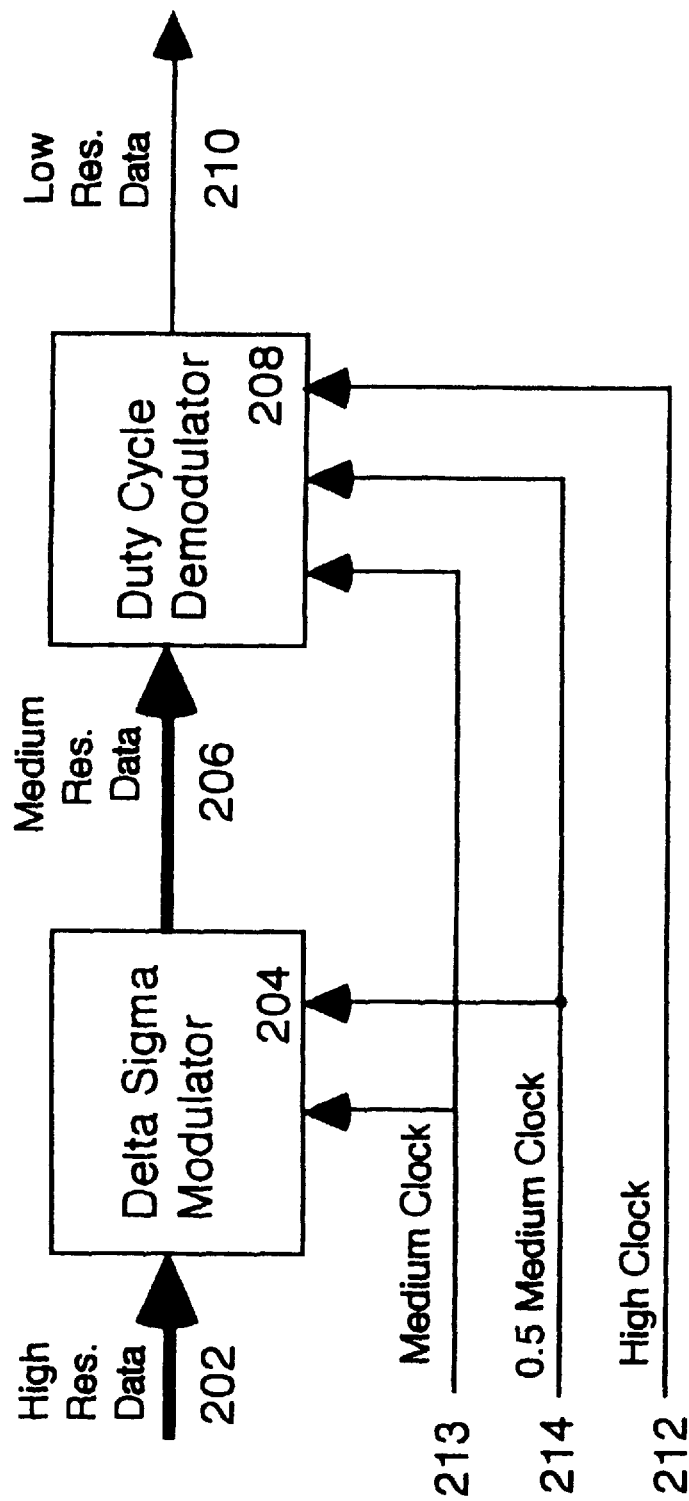
FIG. 5 shows a demodulator according to the present invention, including a delta sigma data converter and a duty cycle demodulator.

FIG. 5 shows a demodulator which might be used in an over-sampling D/A converter such as the one shown in FIG. 4, replacing demodulator 69 in that figure. High resolution data 202; for example, 12 to 20 bit data, enters delta sigma converter 204. The sample rate of this data has already been increased from the low rate clock required to code the data, to a medium rate clock used to clock the delta sigma converter. The ratio of the low to the medium clock will typically be a factor of 32 to 1024; for example, a low clock of 16 kHz to a medium clock of 1 MHz. Delta sigma modulator 204 is clocked by medium clock 213 (for example, at 1 MHz), to generate medium resolution data 206 (2 to 5 bit, for example). Duty cycle demodulator 208 is clocked by medium clock 213 and high clock 212. The frequency of the high clock is a multiple of the medium clock, for example 16 MHz. Duty cycle demodulator 208 is shown in more detail in FIG. 6. The output of duty cycle demodulator 208 is low resolution data 210, typically in one or two bit format, at the high clock rate.

The optional 0.5 medium clock 214 is used for alternating output data formats, such as the alternating output data format shown in FIG. 7E below. Since two different output formats are used in alternating fashion, the 0.5 medium clock rate selects one of the formats for every other data frame output from ROM 220 (shown in FIG. 6). For example, for each even frame, 0.5 medium clock 214 would be low, telling ROM 220 to use the grow from right format. For odd frames, 0.5 medium clock 214 would be high, and the grow from left format would be used. 0.5 medium clock 214 is not used for the data formats shown in FIGS. 7A–D, because these formats do not alternate. ROM 220 must be twice as big for the alternating case, in order to hold both formats (grow from right and grow from left in the 7E case). Delta sigma modulator 204 also uses 0.5 medium clock 214 for the alternating case, because a different correction factor will be used depending upon which output format is being applied by ROM 220.

Figure 6:
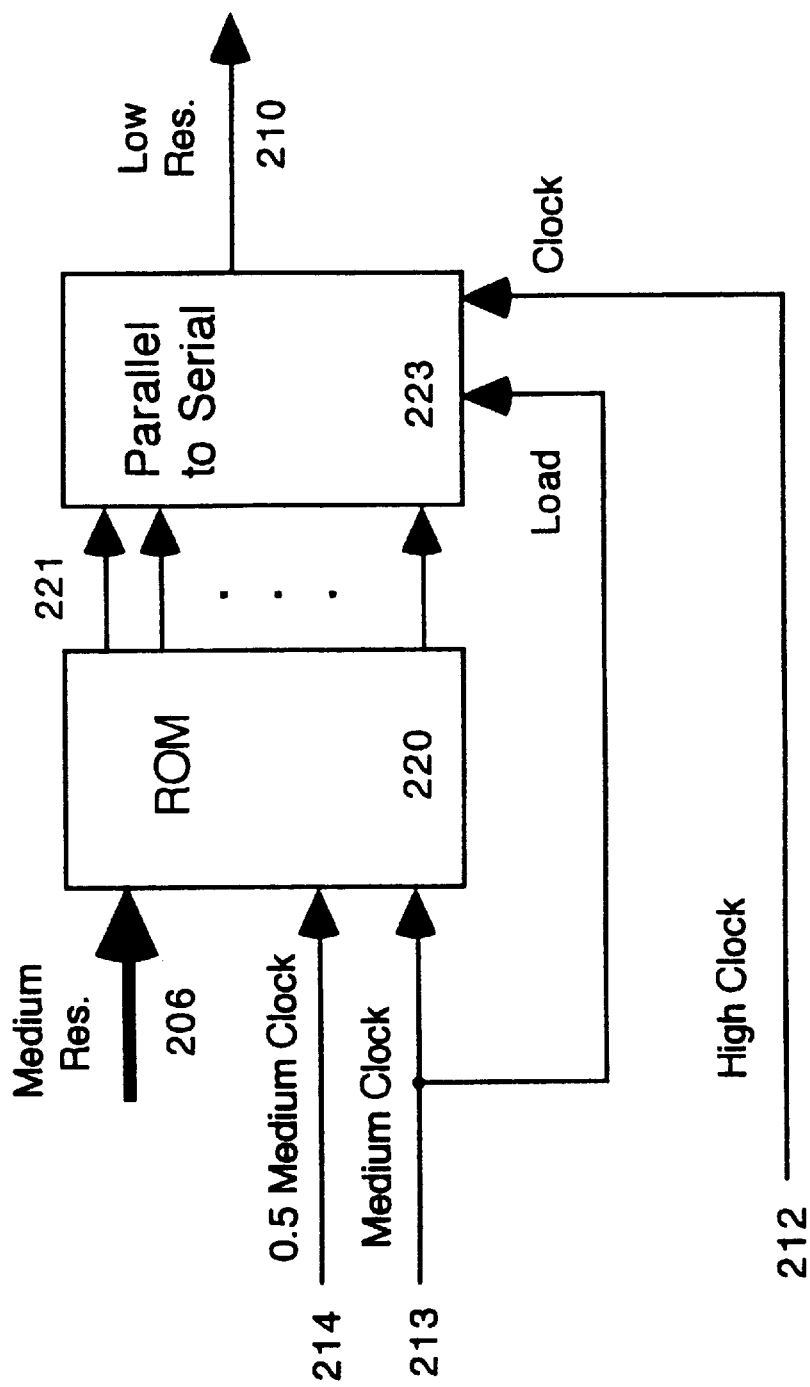
FIG. 6 shows a more detailed diagram of the duty cycle demodulator of FIG. 5.

FIG. 6 shows duty cycle demodulator 208 in more detail. Duty cycle demodulator 208 comprises combinatorial logic only, and does not involve any feedback loops. Thus it is deterministic, and has little or no memory (carries minimal state). In the preferred embodiment, duty cycle demodulator 208 comprises a ROM 220 containing a lookup table, and a parallel to serial data converter 223. Medium resolution input data 206 is used to look up data in ROM 220, which is output in parallel over lines 221. The data stored in ROM 220 is chosen to minimize the number of transitions in its output, thus minimizing the amount of power needed to drive the demodulator. Depending upon what is stored in ROM 220, the data on lines 221 may be in variety of useful, low transition rate formats, such as those shown in FIGS. 7A–7E. The ratio between high clock 212 and medium clock 213 is determined by the number of parallel lines 221. For example, if there are 16 parallel lines 221, high clock 212 might run at 16 MHz and medium clock 213 might run at 1 MHz. Parallel to serial data converter 223 would receive 16 bits of data in parallel at 1 MHz and output serial data at 16 MHz. High clock 212 is only required to run parallel to serial converter 223.

Those skilled in the art will appreciate that many well known structures could be used to implement duty cycle demodulator 208. For example, the look up function could be done with gates instead of ROM 220. Or the data could be clocked out in two chunks of eight bits each, for example. The parallel to serial conversion could be done in several stages. Its output could be two parallel bits rather than one. The duty cycle demodulator could also be realized by logic decodes applied to the output of the frequency divider which produces the medium clock from the high clock. State machine implementations could also be used.

A pulse width demodulator is one example of a possible duty cycle demodulator 208. In this case, the contents of ROM 220 would implement the grow from left pattern shown in FIG. 7D.

Figure 7A:
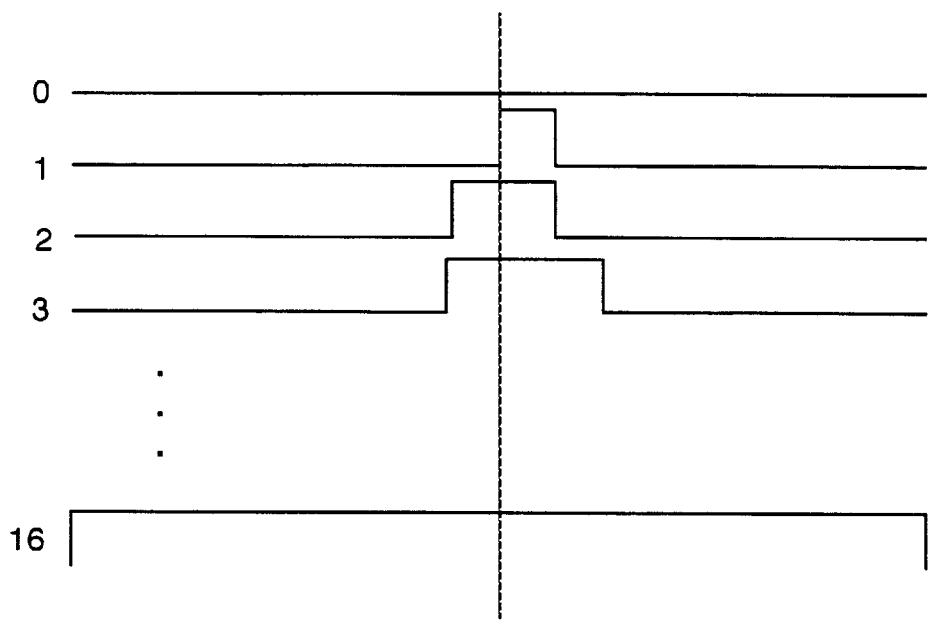
FIG. 7A shows the centered, growing to the right format.
Figure 7B:
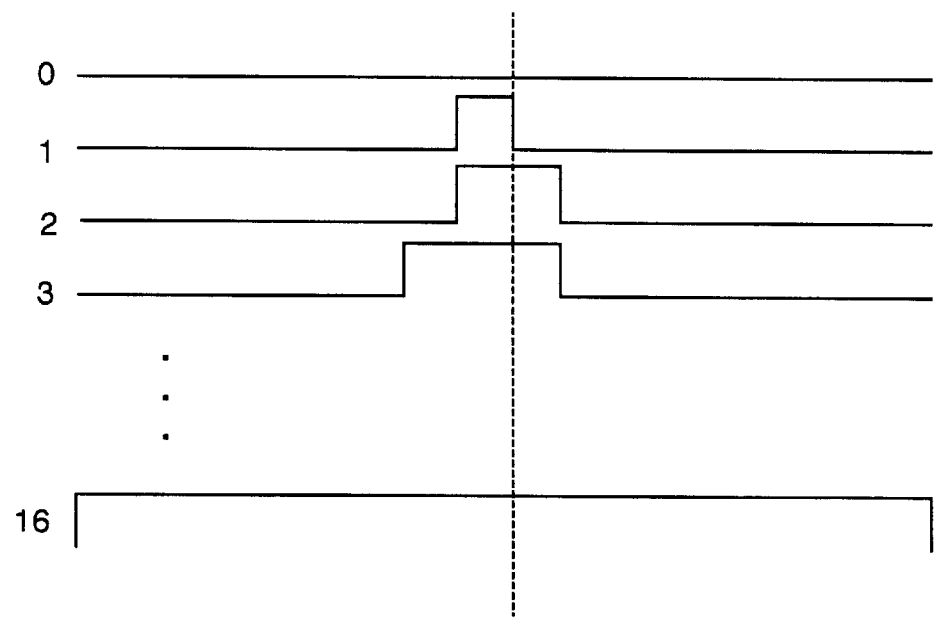
FIG. 7B shows the centered, growing to the left format.

FIG. 7 is composed of FIGS. 7A through 7E, and shows several possible data formats output from duty cycle demodulator 200 of FIG. 6. FIG. 7A shows the centered, growing to the right format. Thus, a one is to the right of the center line, and a three has two bits to the right and one bit to the left. The even number values are centered. FIG. 7B shows the centered, growing to the left format. Thus, a one is to the left of the center line and a three has two bits to the left and one bit to the right.

Figure 7C:
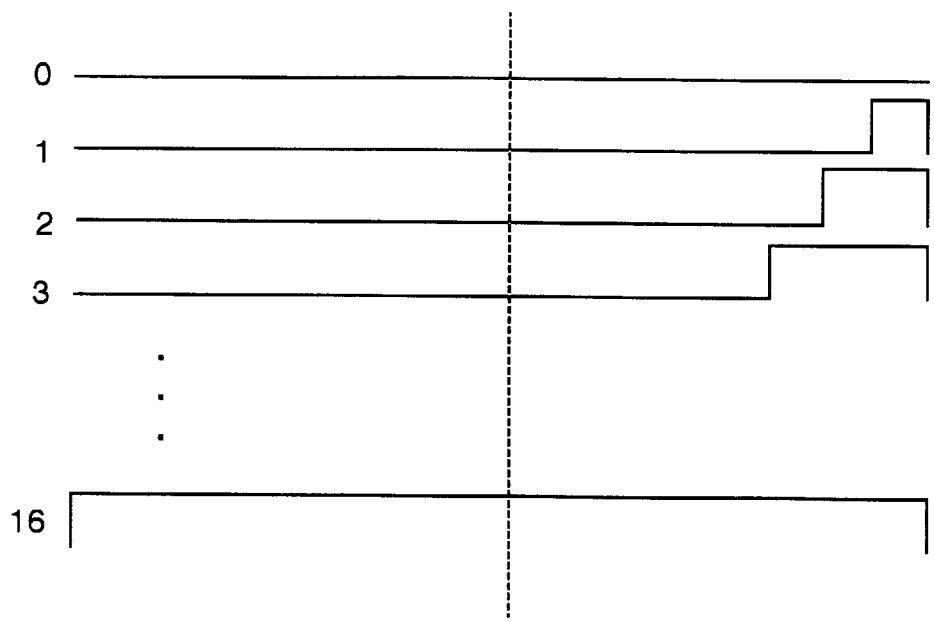
FIG. 7C shows the growing from the right format.
Figure 7D:
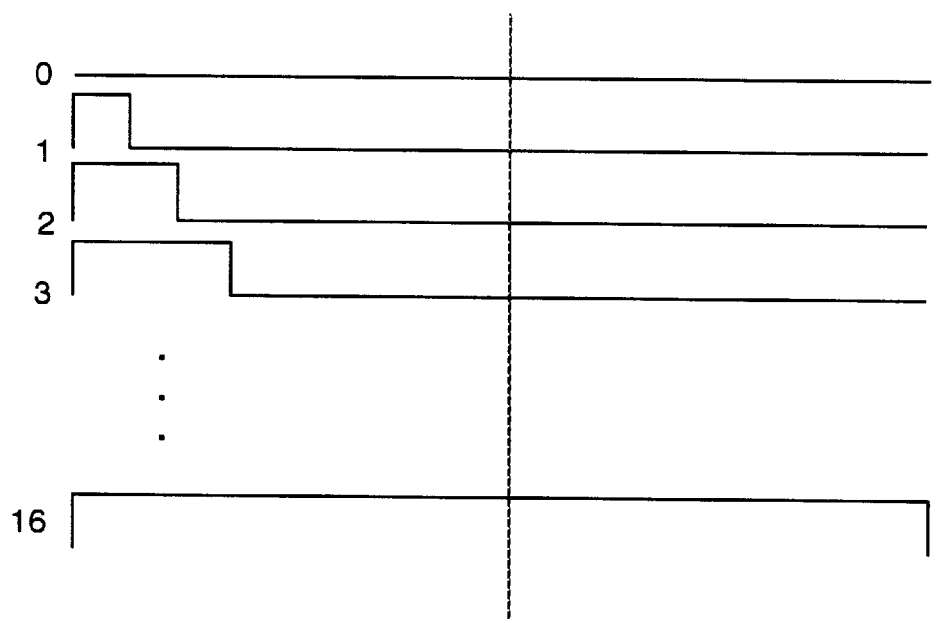
FIG. 7D shows the growing from the left format.

FIG. 7C shows the growing from the right format. FIG. 7D shows the growing from the left format. The growing from the left and growing from the right formats result in larger discontinuity noise than the other formats, and so are somewhat less useful.

Figure 7E:
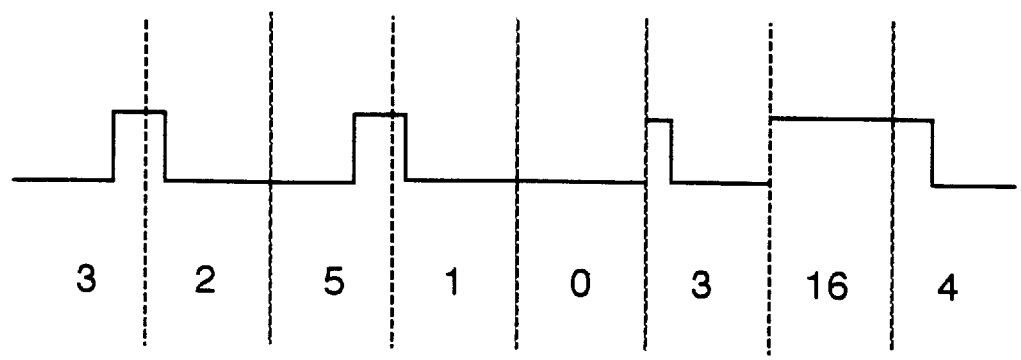
FIG. 7E shows alternating format, wherein odd cycles grow from the right, and even cycles grow from left.

FIG. 7E shows the alternating format wherein odd cycles grow from the right, and even cycles grow from the left. This format is particularly useful, because it requires half as many output data transitions as any of the above formats. However, the design is more complex, as described above. To illustrate this format, the following values are shown in sequence: 3, 2, 5, 1, 0, 3, 16, 4. Obviously, it would be equivalent to have odd cycles grow from the left, and even cycles grow from the right.

In all of the formats shown in FIGS. 7A–7E, the area under the output curve (first integral) is directly proportional to the input value. In other words, the first order effect is equivalent to an ideal impulse function. This is not true, however, for the second integral, which will induce some level of distortion. A simple description is that the center of gravity of the signal does not remain at the same time position in the signal. Compensation is required to achieve low distortion and good signal to noise ratio.

Figure 1:
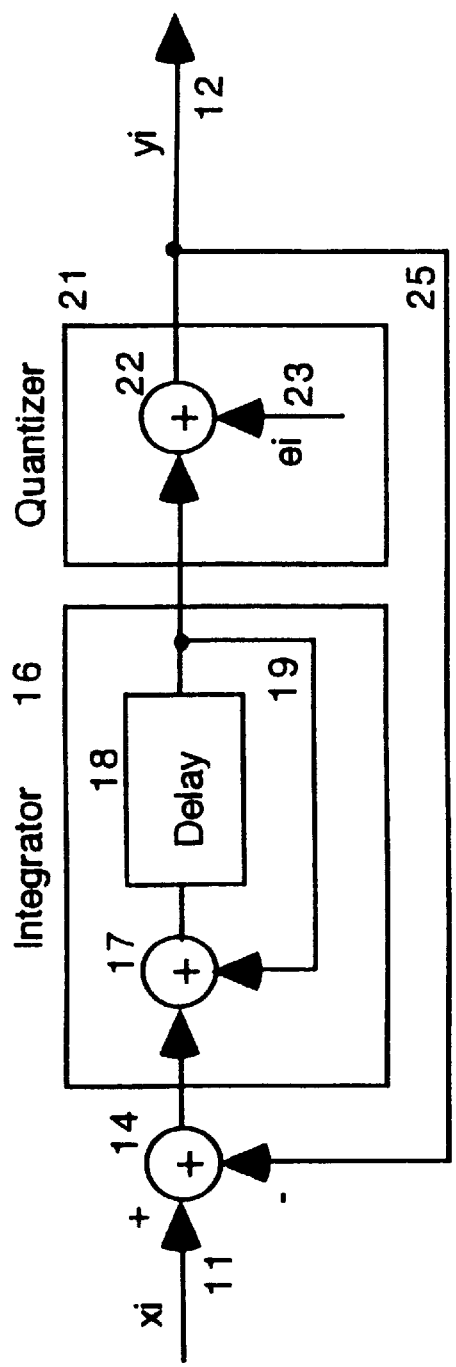
FIG. 1 (prior art) shows a well-known first order delta sigma quantizer.
Figure 2:
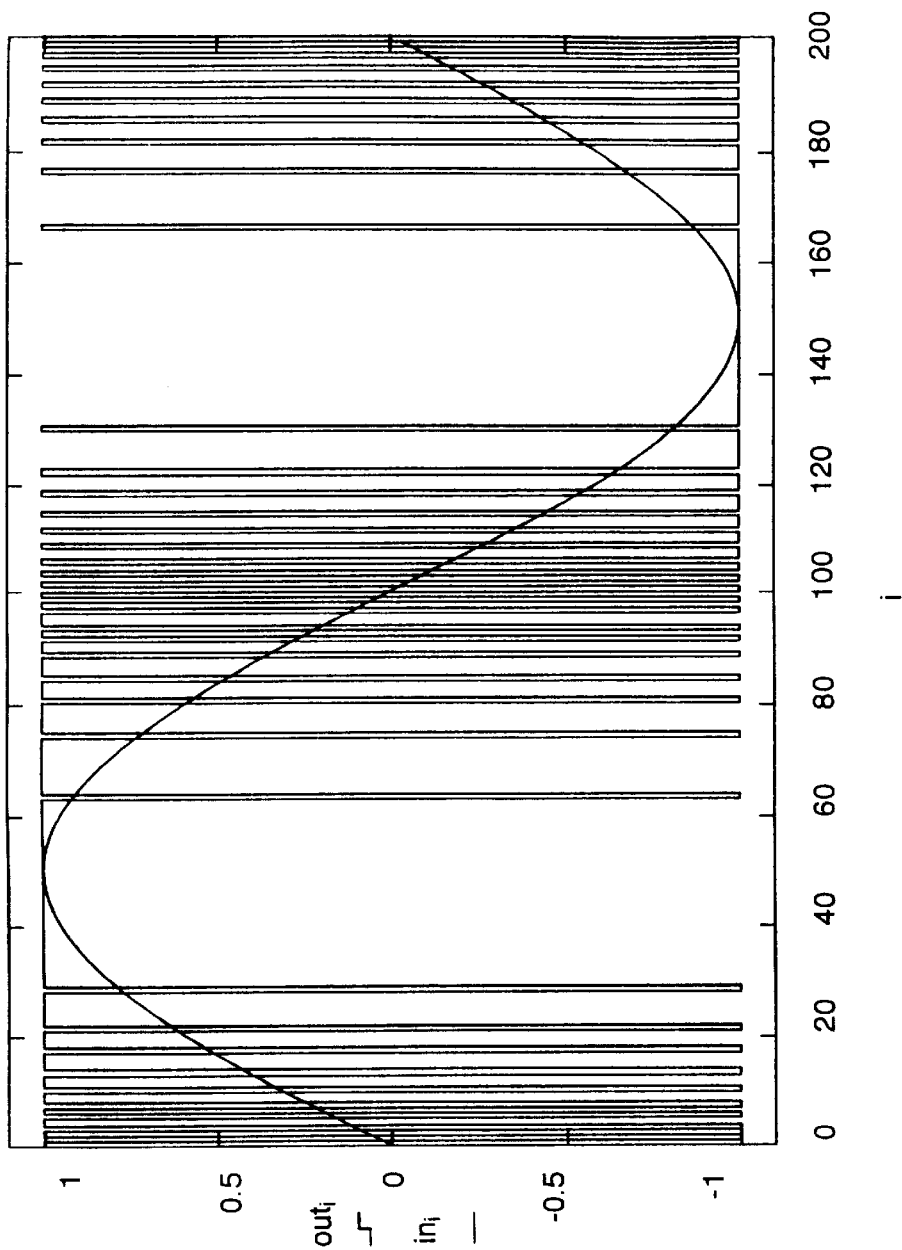
FIG. 2 shows output yi for a sinusoidal input xi, for the quantizer of FIG. 1.
Figure 3:
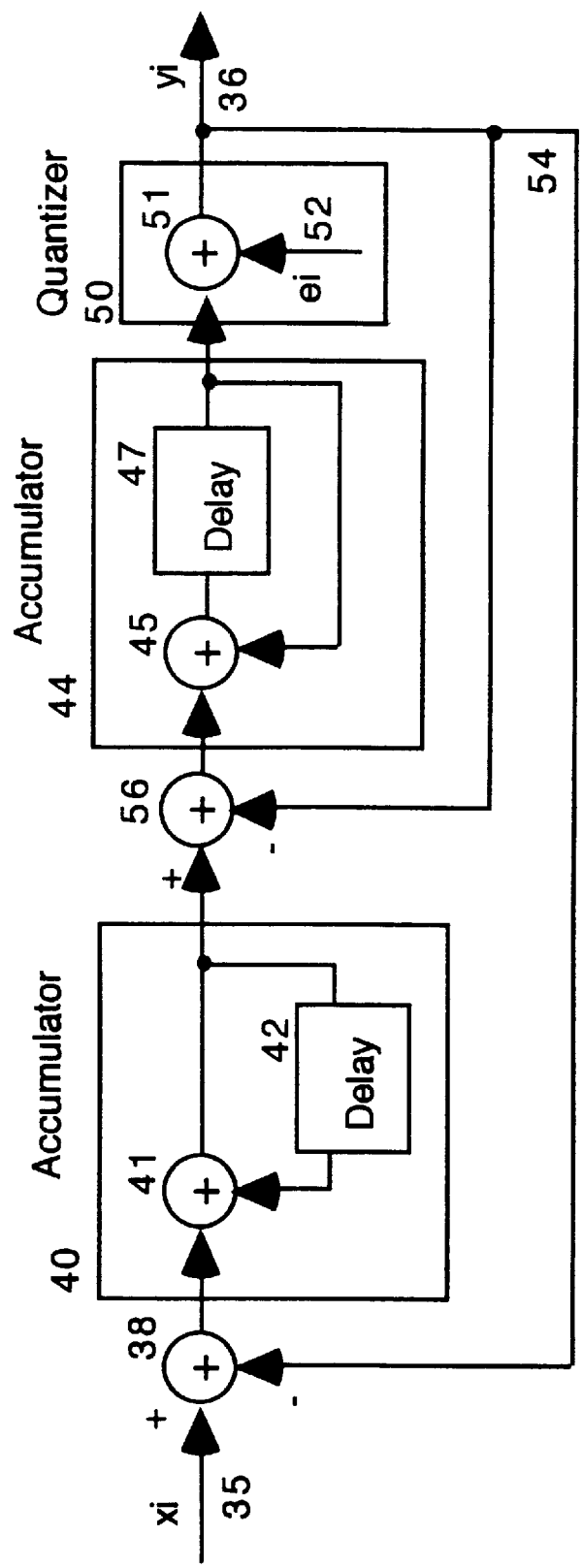
FIG. 3 (prior art) shows a common second order delta sigma quantizer.
Figure 8:
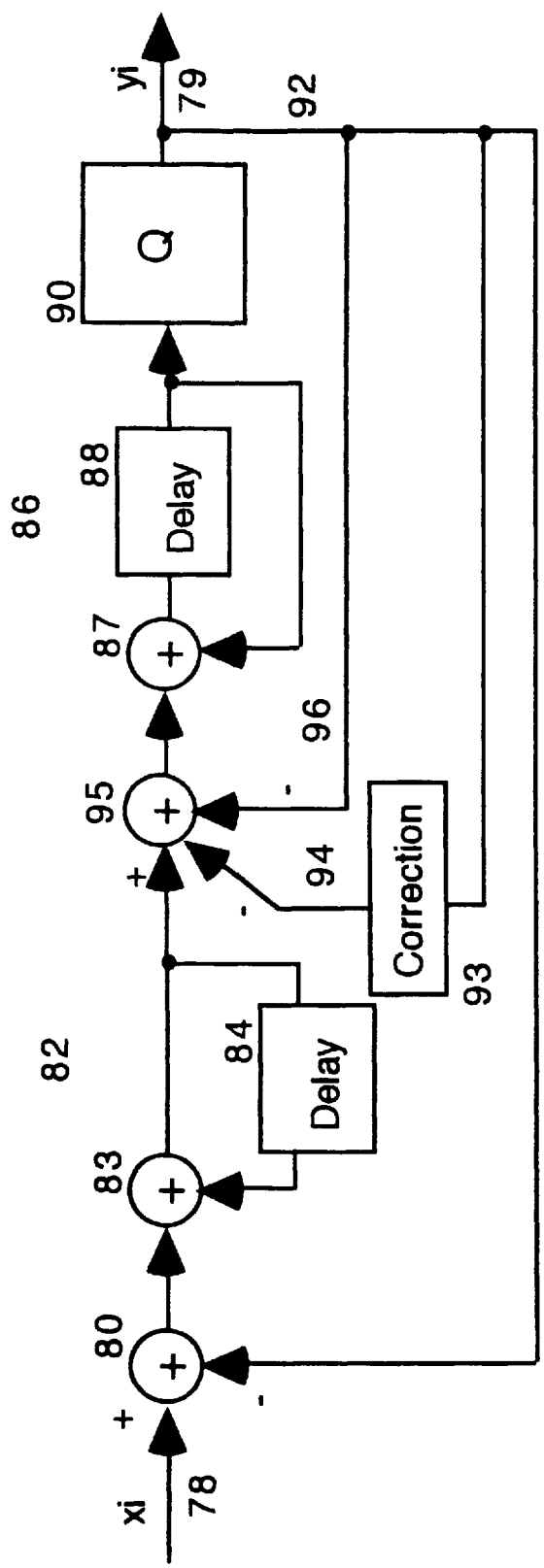
FIG. 8 shows a second order delta sigma quantizer, having feedback compensated for low transition demodulator output data, according to a first embodiment of the present invention.

FIG. 8 shows a first embodiment of a second order delta sigma quantizer which could be used as delta sigma converter 204 of the demodulator of FIG. 5. The delta sigma converter of FIG. 8 has feedback 92 compensated for the format applied to the data by duty cycle demodulator 208. The structure of the embodiment of FIG. 8 is identical to the structure of the second order delta sigma quantizer of FIG. 3, except that the feedback into adder 95 has been corrected by correction block 93, and quantizer 90 is a multiple bit quantizer.

Input xi, 78, is added to feedback signal 92 by adder 80. The signal from adder 80 is fed into first accumulator 82, comprising delay 84 and adder 83. The output of accumulator 82 is added to corrected feedback signal 94 and fed into second accumulator 86, comprising delay 88 and adder 87. The output of accumulator 86 goes into multibit quantizer 90. Quantized output 79 (yi) also feeds back as feedback signal 92. Quantizer 90 has more than two signal levels for its output.

Correction block 93 is shown as a black box which has feedback signal 92 as an input and correction signal 94 as an output. In the preferred embodiment, correction block 93 uses signal 92 to lookup a correction factor in ROM, and supplies it to adder 95 to be added to feedback signal 96.

Equivalently, correction block could have as its output a signal comprising feedback signal 92 added to the correction factor. Then, feedback signal 96 would be removed.

Figure 13:
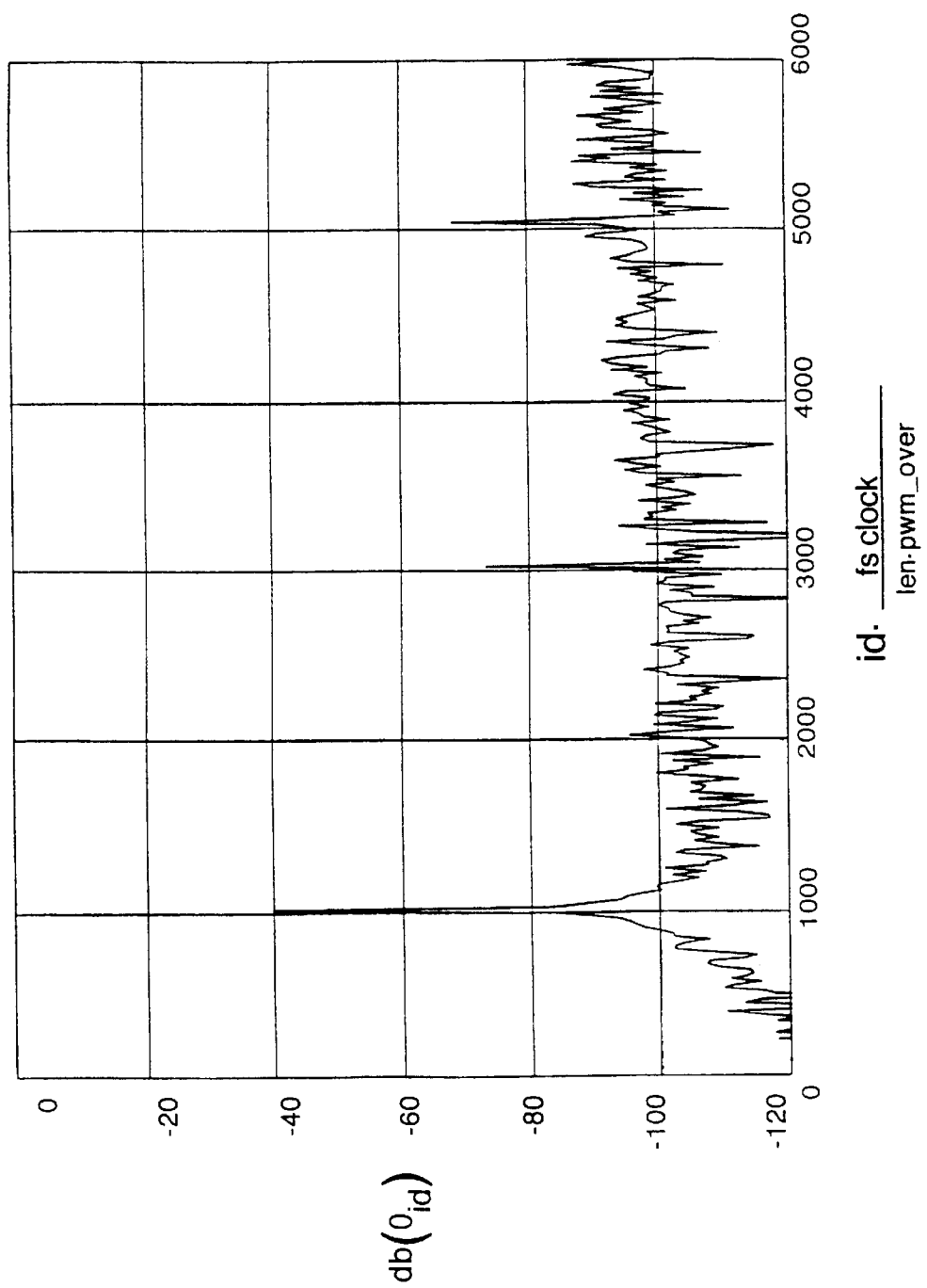
FIG. 13 shows the output signal of the demodulator of FIG. 5, which utilizes a delta sigma quantizer without the compensation of the present invention, for an input signal comprising a sine wave at −40 dB.

The contents of the ROM of correction block 93 are chosen to correct for the format of the data output from duty cycle demodulator 208. The required output of the correction block can be simply calculated by taking the second integral of the output data patterns, and subtracting the ideal, linear value. FIG. 13 shows a C program simulation of a demodulator utilizing the centered, grow to the right, format of FIG. 7A. The ROM utilized in that program (using that choice of parameters, data formats, clock ratios, etc.) would be designed as follows:

1) Choose a 0 time position. In this case, we will use the center of the time frame as 0.

2) Calculate the times of the center of each single unit pulse. In the present example they are (left to right):

−15/32
−13/32
−11/32
−9/32
−7/32
−5/32
−3/32
−1/32
1/32
3/32
5/32
7/32
9/32
11/32
13/32
15/32

3) Sum the elements from the above calculation that are used within any given pulse. As an example, for the 1 wide case, 1/32 is used, and the sum is 1/32. For the 2 wide case, −1/32, 1/32 are used, and the sum is 0. For the three wide case, −1/32, 1/32, 3/32 are used, and the value is 3/32. For the five wide case, −3/32, −1/32, 1/32, 3/32, 5/32 are used, and the value is 5/32. This value is multiplied by the feedback value for a single step, in the case of the C program of FIG. 17, 2048 (hex 0800), to get the correction table value 320 for the 5 entry (hex 0140).

As these pulses are growing to the right, the odd outputs are late relative to the center. Therefore, the correction term will have signs opposite to the feedback term.

It is also possible to use a correction factor in each feedback loop of the delta sigma converter of FIG. 8 (i.e., compensate the path to adder 80 as well as to adder 95). This technique would be used if the output stage was nonlinear in energy, but in normal cases this compensation path would be a one-to-one function (i.e. uncompensated).

Figure 9:
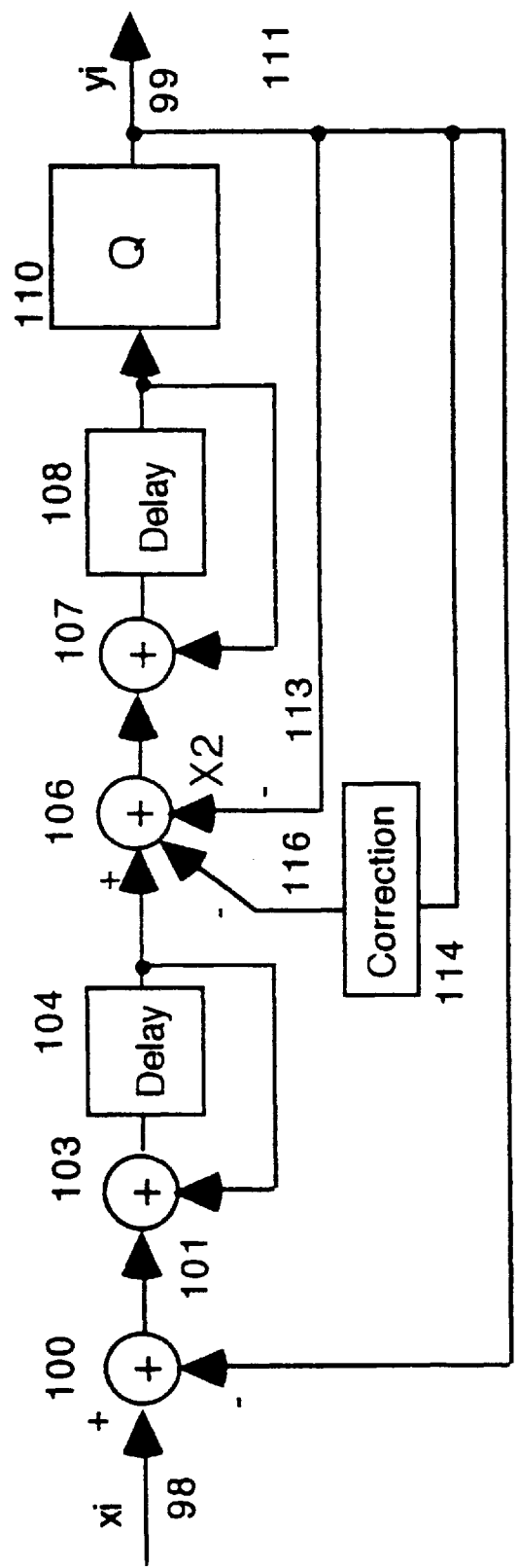
FIG. 9 shows another compensated second order delta sigma quantizer according to a second embodiment of the present invention.

FIG. 9 shows another compensated second order delta sigma quantizer according to a second embodiment of the present invention. It is shown and described in order to illustrate how the compensation function may be used in any delta sigma quantizer.

In the compensated delta sigma quantizer of FIG. 9, input signal xi, 98, is added to the negative of feedback signal 111 by adder 100, to form signal 101. Adder 103 adds 101 to the signal from delay 104, and feeds the result to adder 106. Adder 106 adds this signal to the negative of signal 113, which is feedback 111 multiplied by 2, and to signal 116 which is the correction term formed by correction block 114.

The output of adder 106 is added to the signal from delay 108 by adder 107. The result is quantized by quantizer 110 to form output 99 and feedback signal 111. Feedback 111 is compensated for variable center of gravity by correction block 114, as described above.

Figure 10:
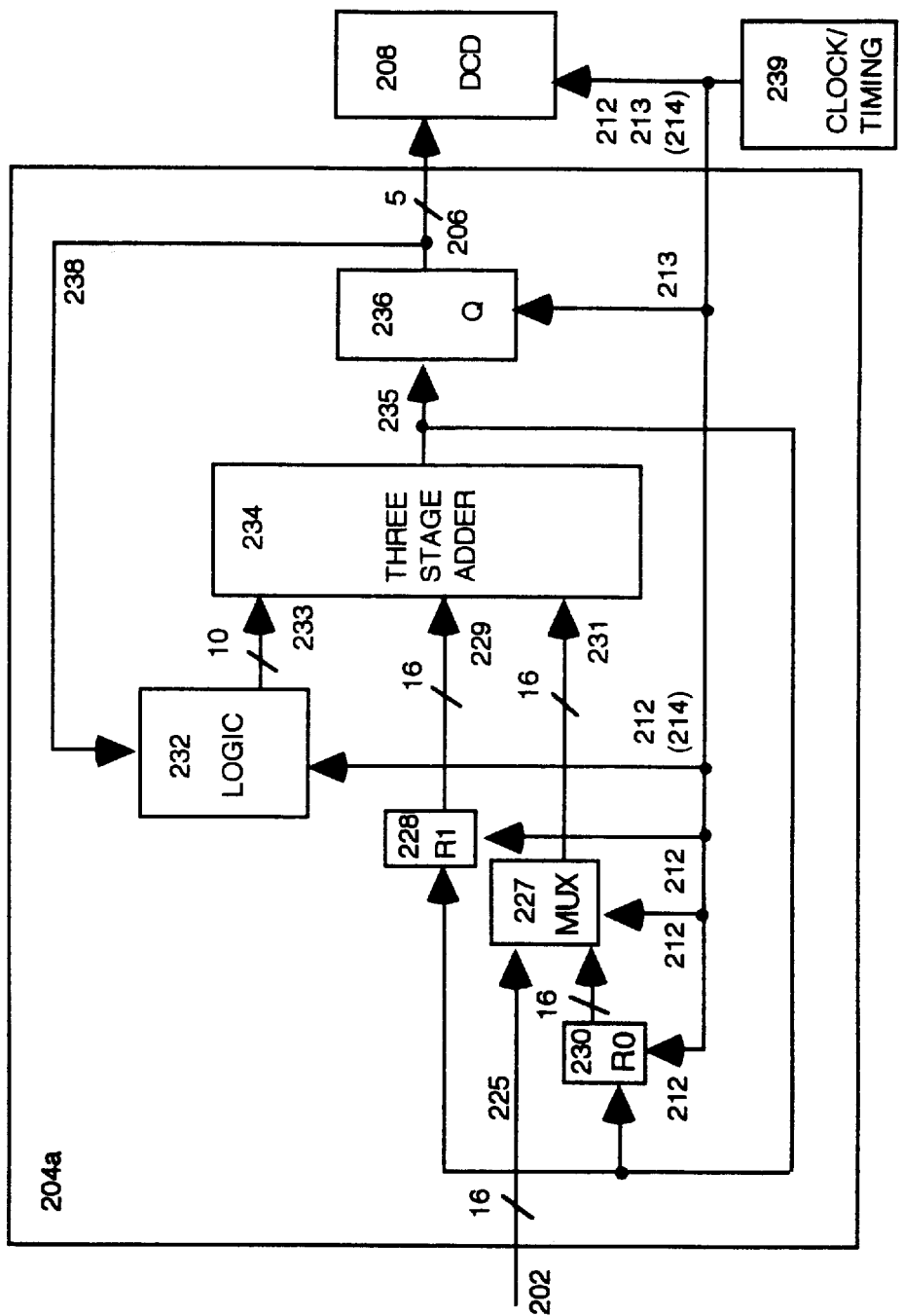
FIG. 10 shows a demodulator according to the present invention, utilizing a third compensated second order delta sigma quantizer.

FIG. 10 shows a demodulator in accordance with the present invention, utilizing a second order compensated delta sigma converter 204a. This particular implementation is especially appropriate for use with a duty cycle, as the mathematics are performed in multiple phases. Delta sigma converter 204a might be the delta signal converter shown in the signal flow graph of FIG. 11, which is an improvement on the second order delta sigma converters shown in FIGS. 8 and 9. The demodulator of FIG. 10 has been simulated by a C program shown in FIG. 17. FIGS. 13 through 16 show the performance of this circuit with the correction block turned on and off for two different signal levels.

The same numbering scheme is used in FIG. 10 as was used in FIG. 5, where the blocks are equivalent. Delta sigma modulator 204a of FIG. 10 is slightly different from delta sigma modulator 204 of FIG. 5, as described below. High resolution data 202 is input into delta sigma modulator 204a. For the example of FIG. 10, high resolution data 202 is sixteen bits. Delta sigma modulator 204a outputs medium resolution data 206, in this case five bits of data corresponding to 17 levels, to duty cycle demodulator 208. One difference between the demodulator of FIG. 5 and that of FIG. 10 is that high clock 212 is used by delta sigma modulator 204a of FIG. 10, to implement three stage adder 234, as described below.

Figure 11:
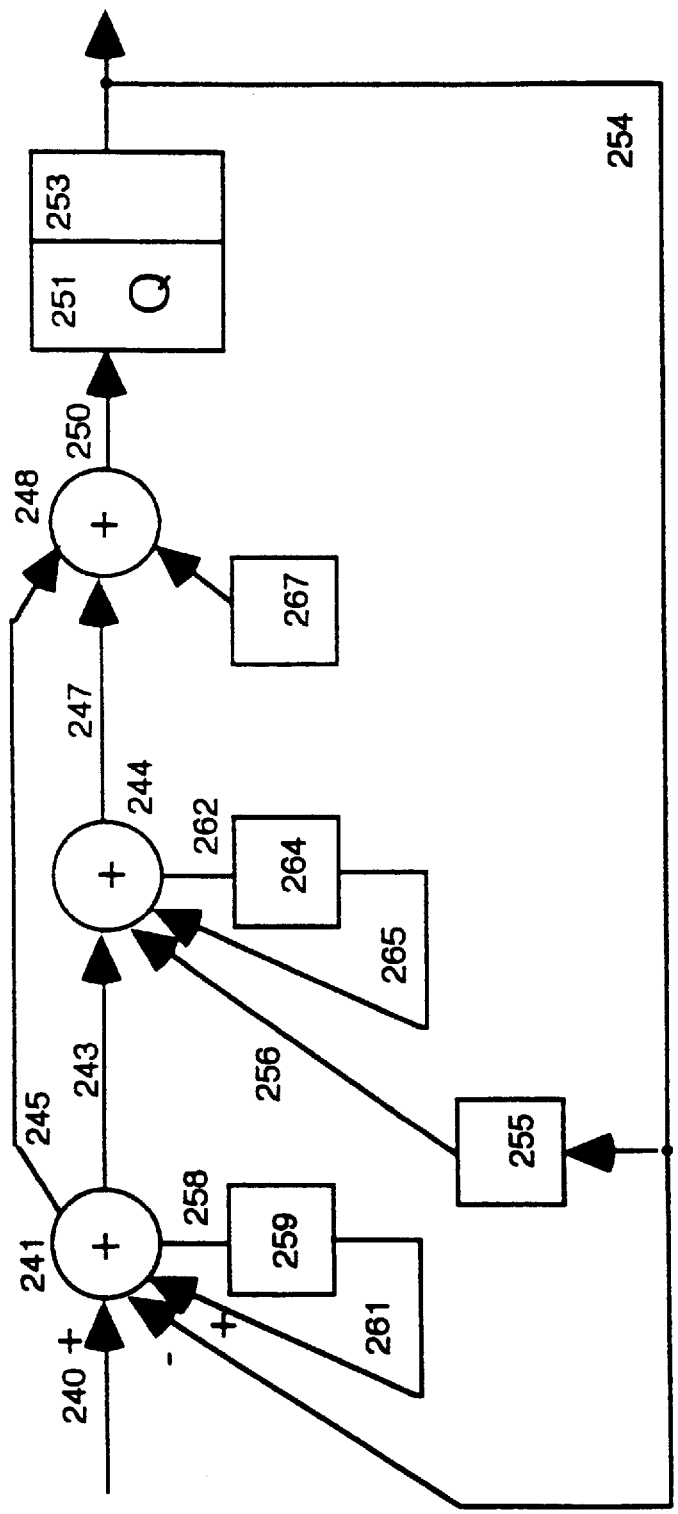
FIG. 11 shows a signal flow graph of a delta sigma quantizer which could be used in FIG. 10.

The circuit of FIG. 10 is very efficient, because it utilizes one three stage adder 234 to implement all three of the input adders (241, 244, and 250) of FIG. 11. This is possible because the adders always operate in sequence. The output of adder 241 in FIG. 11 feeds into adder 244, which feeds into adder 248. Each adding operation is performed by adder 234, while the inputs to adder 234 are determined by logic block 232 and multiplexor 227. The input to register 236 is disabled when adder 234 is acting as one of the first two adders (241, 244), and is enabled when adder 234 is acting as the third adder 248.

Thus, delta sigma modulator 204a of FIG. 10 steps through the three adder stages as follows. Adder stage 0 (241 in FIG. 11) has as its inputs: high resolution input data 202 selected by MUX 227 and passed to adder 234 (240 in FIG. 11), the delayed output of the first adder signal 235, passed through register 228 (signal 258 is put through delay 259 to form delayed signal 261 in FIG. 11), and feedback signal 238, which is selected and passed to adder 234 by logic 232 (feedback signal 254 in FIG. 11).

Adder stage 1 (244 in FIG. 11) has as its inputs: the output of the first adder stage, stored in register 228 and provided to adder 234 (signal 243 in FIG. 11), a correction factor (correction block 255 forms corrected feedback signal 256 in FIG. 11), and the delayed output of the second adder stage which is stored in register 230 and selected by MUX 227 (adder 244 output 247 is delayed by delay 264 to form delayed signal 265 in FIG. 11). For both adder stage 0 and adder stage 1, register 236 blocks signal 235.

Adder stage 2 (248 in FIG. 11) has as its inputs: a dither signal to prevent the system from generating tones, formed by logic 232 and passed to adder 234 (generated by block 267 in FIG. 11), the output of the first adder stage, still stored in register 228 and provided to adder 234 (signal 245 in FIG. 11), and the output of the second adder stage 229, forwarded by register 230 to MUX 227 (Signal 247 in FIG. 11). Since the results of this adder stage 2 will be output (after being passed through quantizer 251 and incorporated delay 253 in FIG. 11), register 236 accepts the sixteen bit output signal 235 from adder 238 and quantizes it, outputting it as medium resolution (5 bit) data 206, to duty cycle demodulator 208.

Clock and timing block 239 provides medium clock 213, 0.5 medium clock 214 (if used) and high clock 212. In FIG. 5, only medium clock 213 (and 0.5 medium clock 214, if used) are needed by delta sigma modulator 204, because each adder is implemented separately, and none need to operate at a higher rate than the medium clock. For delta sigma modulator 204a of FIG. 10, however, signals derived from high clock 212 are required by multiplexor (MUX) 227, register 228 and 230, and logic 232, in order to fit three stages of adding into the timeline allowed for one frame of output data. Register 236 only requires medium clock 213. If 0.5 medium clock 214 is used (because the format applied by duty cycle demodulator 208 alternates, requiring correction logic within logic block 232 to alternate) 0.5 medium clock 214 is provided to logic block 232 and to duty cycle demodulator 208.

Obviously, high clock 212 runs at a higher rate than is required to have three adding stages. Up to sixteen adding stages could operate within delta sigma modulator 204a, if required, for example by a higher order delta sigma modulator. The additional adding stages may also be used to implement multiple input processing, such as stereo input. In this embodiment, input signal 202 would provide the right channel (for example) for three adding phases and then would provide the left channel for three phases. All registers would have two copies. Medium resolution signal 206 would alternate between left and right channel signals and circuitry would be provided to separate the right channel from the left channel and provide them to different speakers. Any extra time phases are not used.

Figure 12:
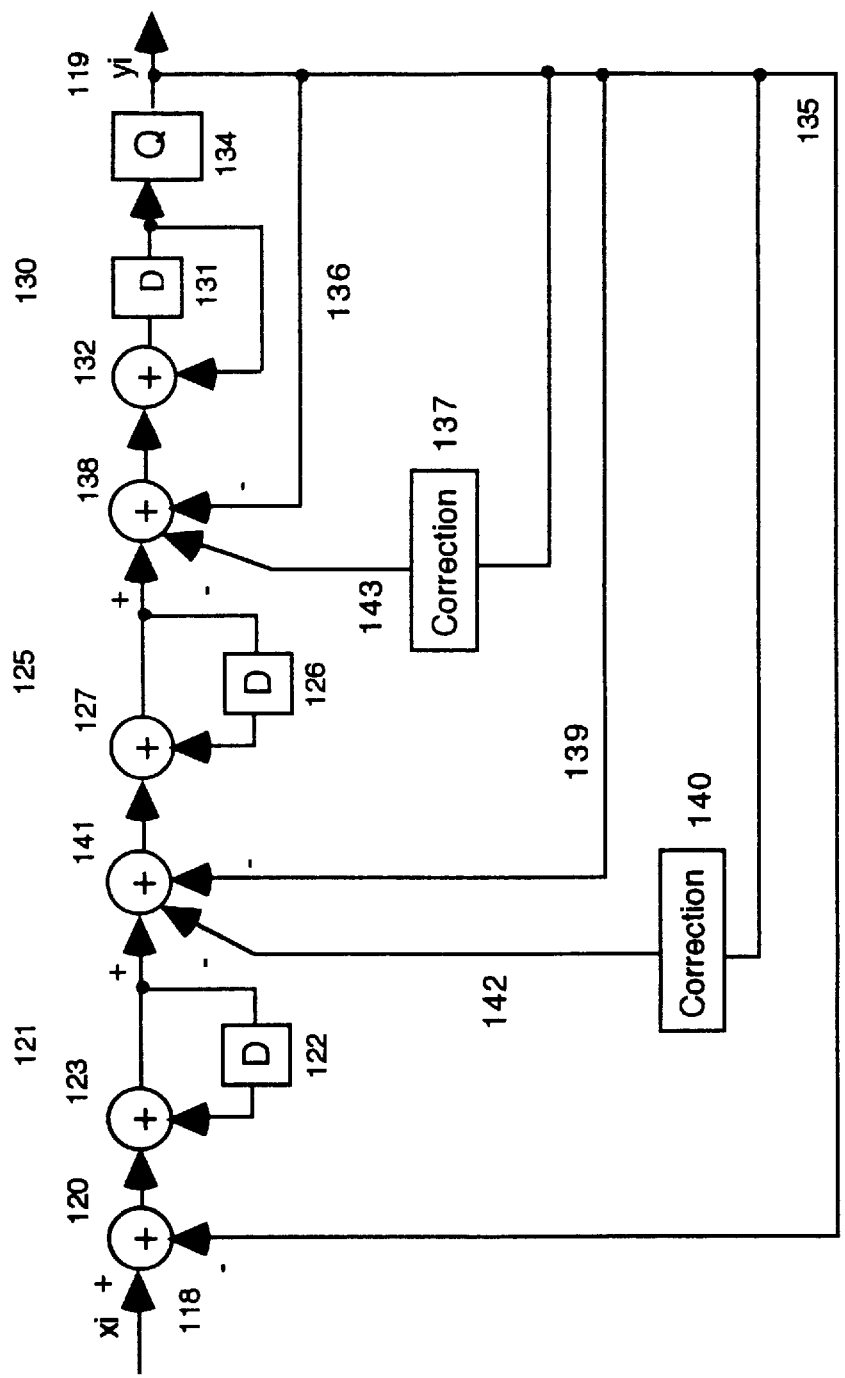
FIG. 12 shows a compensated third order delta sigma quantizer according to a fourth embodiment of the present invention.

FIG. 12 shows a compensated third order delta sigma converter in accordance with the present invention. The feedback signals into second accumulator 125 and third accumulator 130 must each be compensated for the output format of duty cycle demodulator 208 (shown in FIG. 5). These compensations will, in general, be different for each stage.

Input signal xi, 118, is combined with feedback signal 135 by adder 120 and fed into first accumulator 121. First accumulator 121 comprises delay 122 and adder 123. The output of accumulator 121 is added to feedback 139 and correction factor 142 from correction block 140 and fed into accumulator 125, comprising delay 126 and adder 127. The output of accumulator 125 is added to feedback 136 and correction factor 143 from correction block 137 and fed into accumulator 130, comprising delay 131 and adder 132. The output of accumulator 130 is quantized by quantizer 134 to form output signal yi, 119, and feedback signal 135. Correction blocks (for example ROMs) 140 and 137 compute correction factors 142 and 143 as described above.

FIGS. 13 through 16 show the output signal of an over-sampling D/A converter with and without the correction of the present invention, for two different signal levels. The D/A converter system is essential identical to the D/A converter of FIG. 4, with the modulator shown in FIGS. 10 and 11 being used for demodulator 69. For FIGS. 13 and 15, the correction is turned off in FIG. 10. For FIGS. 14 and 16, the correction factor in FIG. 10 is applied. The D/A converter is simulated in FIG. 17 to generate each of these output signals.

Figure 14:
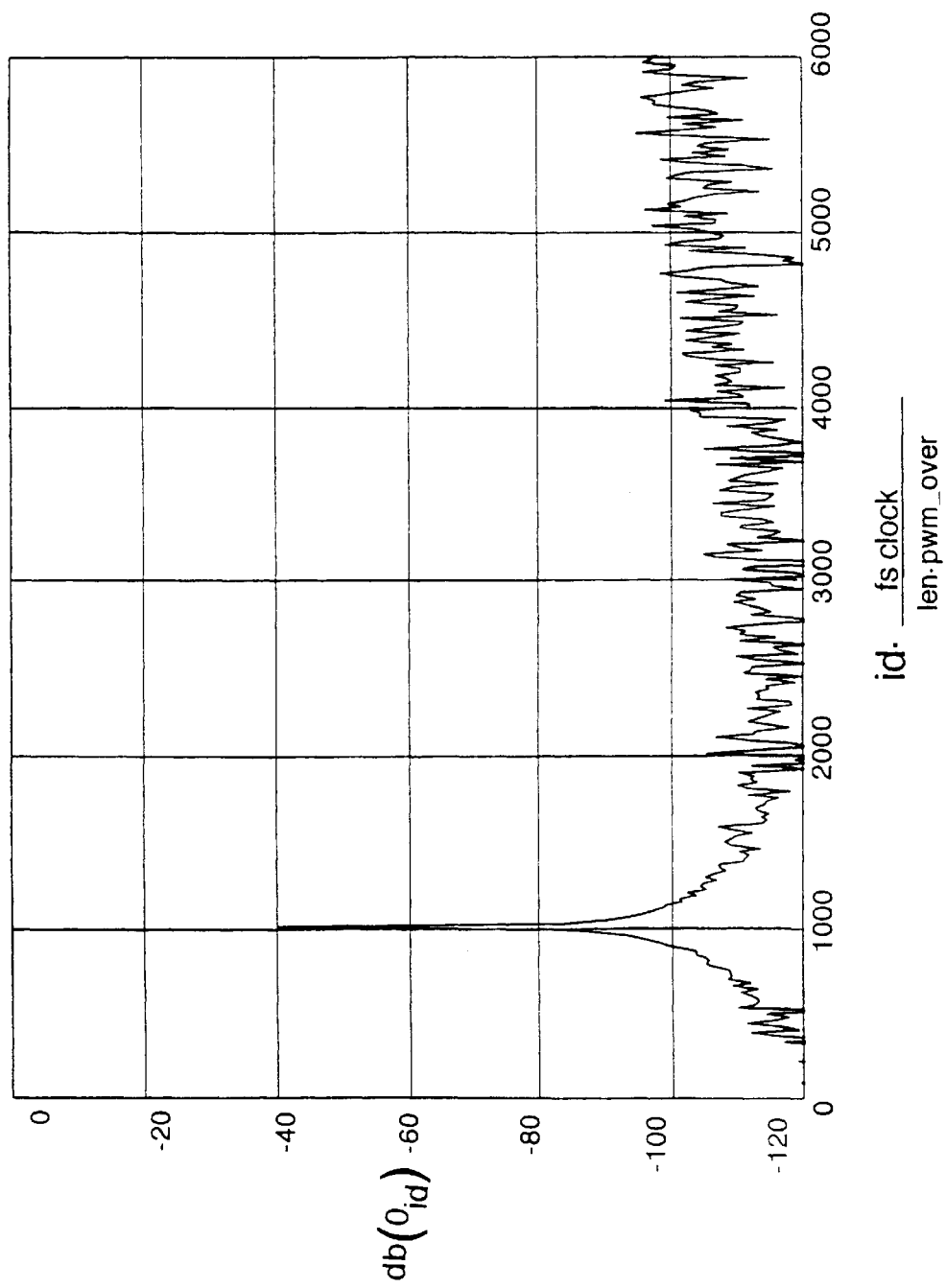
FIG. 14 shows the output signal of the demodulator of FIG. 5, which utilizes the compensated delta sigma quantizer of FIG. 10, for an input signal comprising a sine wave at −40 dB.

FIG. 13 shows the spectrum of the output signal 145, without the compensation of the present invention, for an input signal comprising a sine wave at −40 dB. This figure was generated by the simulation of FIG. 17, with the correction turned off. FIG. 14 shows the spectrum of the output signal with the correction applied, for an input signal comprising a sine wave at −40 dB below full scale. Obviously, the signal to noise ratio has greatly improved.

Figure 15:
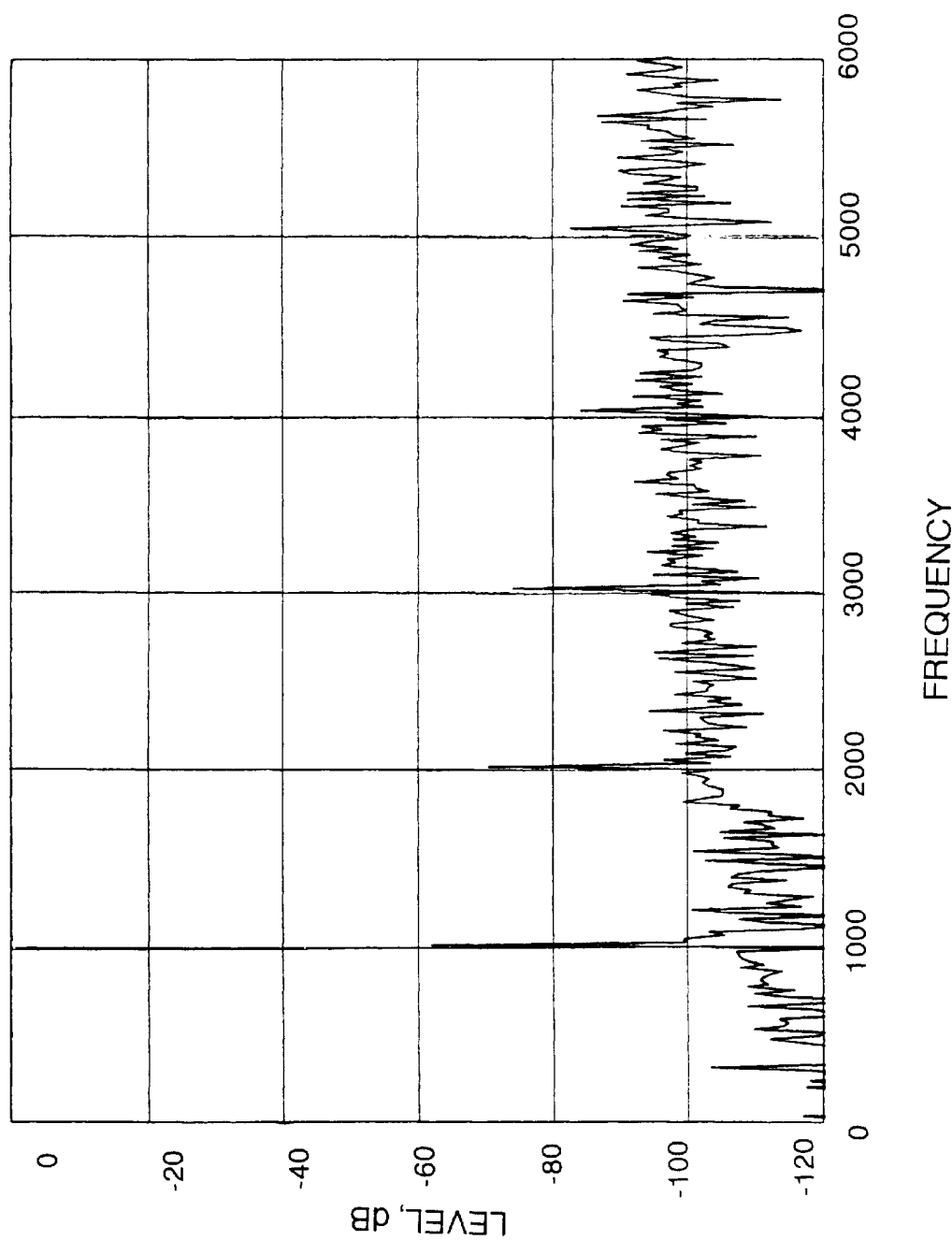
FIG. 15 shows the output signal of the demodulator of FIG. 5, which utilizes a delta sigma quantizer without the compensation of the present invention, for an input signal comprising a sine wave at −60 dB.
Figure 16:
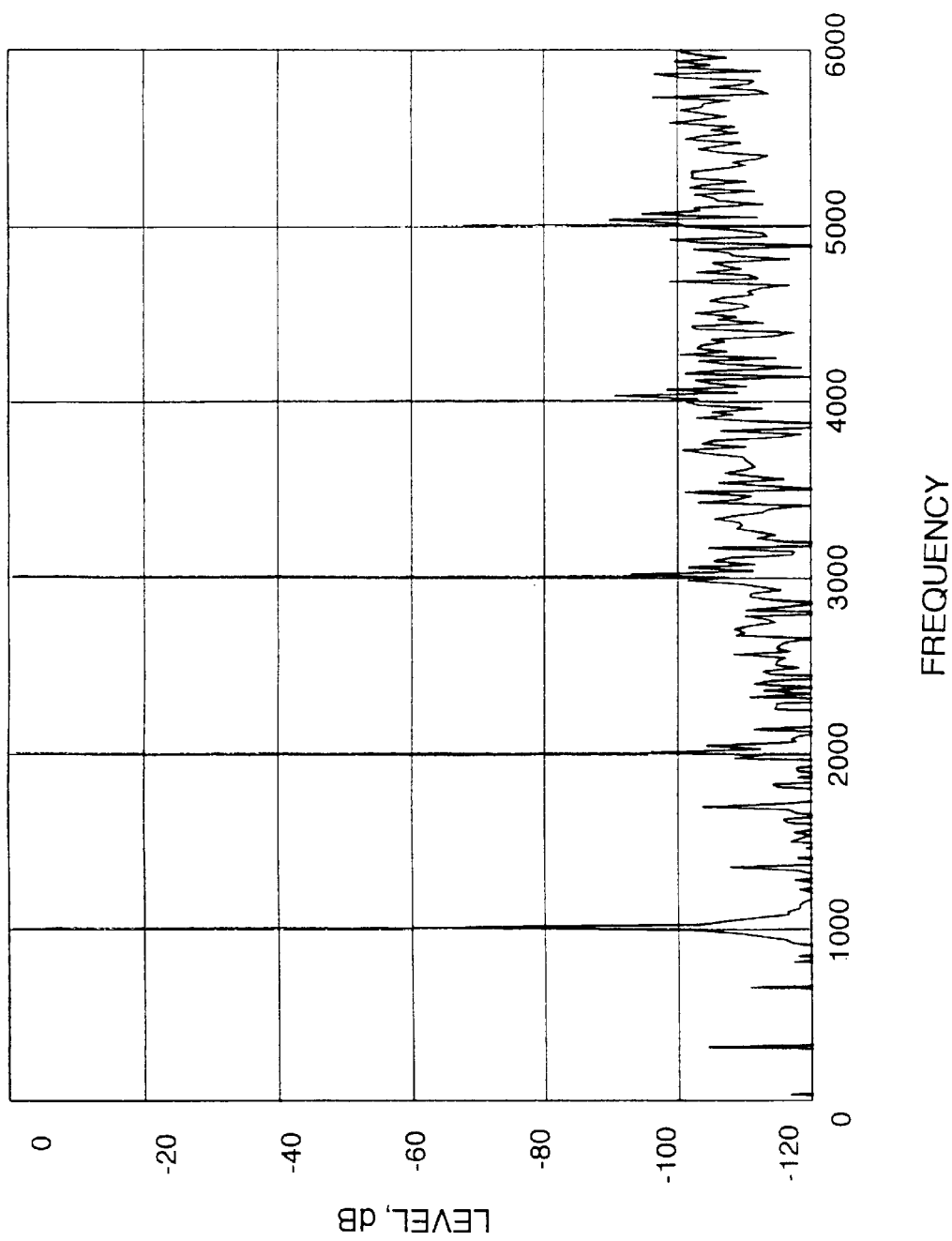
FIG. 16 shows the output signal of the demodulator of FIG. 5, which utilizes the compensated delta sigma quantizer of FIG. 10, for an input signal comprising a sine wave at −60 dB.

FIG. 15 shows the spectrum of the output signal 145 for an input signal comprising a sine wave at −60 dB. This figure was generated by the simulation of FIG. 17, with the correction turned off. FIG. 16 shows the output spectrum with correction, for an input signal comprising a sine wave at −60 dB. With such a low input signal, the output signal is almost lost in the noise in the uncompensated case.

FIG. 17 provides a C program simulation of an oversampling D/A converter, which utilizes the compensated delta sigma quantizer of FIGS. 10 and 11. This particular embodiment applies a centered, growing to the right format, like that shown in FIG. 7A. The input signal is a 16 bit, 2 kHz sine wave. The output is a 1-bit format signal representing the sine wave which would be output by the system of FIG. 10.

In order, the sections of the C program show implementation of a linear feedback function (part of logic block 232), a correction factor applied to the second order feedback (part of logic block 232), and optimized for the centered, growing to the right format, ROM 220 for duty cycle demodulator 208 (centered, growing to the right format), a three input, sixteen bit adder 234 which saturates (overflows take the maximum value and underflows take the minimum value), quantizer 236 (which returns a value in the range 0 to 16), test signal generation (for signal 202), bias (or dither) generator (part of logic block 232), delta sigma modulator 204a, and duty cycle demodulator 208. Arrays fb and cor show feedback and correction signals appropriate for the duty cycle modulator described by the array out_rom. It is understood by those versed in the art that adding a dither signal can improve the quality of the noise generated by delta sigma converter system, and is shown added in this program.

The implementation of delta sigma modulator 204a (called "main") implements the first stage of adder 232 (241 in FIG. 11), whose output is called "r0". "r1" is the output of the second stage of adder 234 (adder 244 in FIG. 11) and "out" is the third stage of adder 232 (adder 248 in FIG. 11) after quantization by quantizer 236 (251 in FIG. 11).

Figure 18:
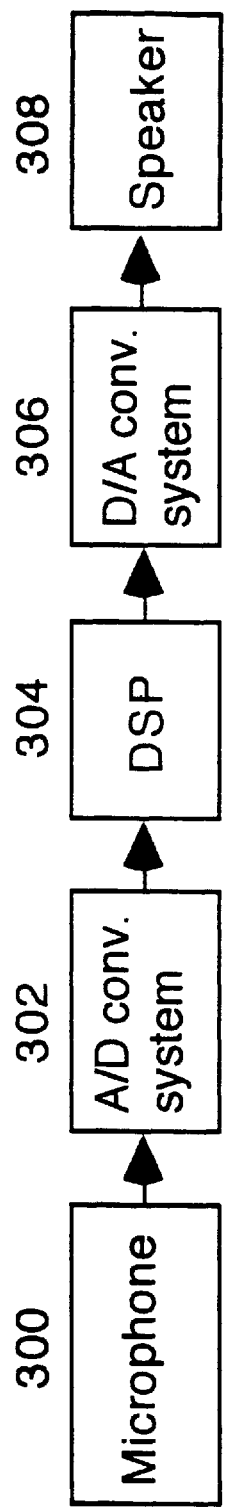
FIG. 18 shows a hearing aid utilizing the demodulator of FIG. 5.

FIG. 18 shows a hearing aid comprising a microphone 300, an A/D conversion system 302, digital signal processing (DSP) 304, a D/A conversion system 306, and a speaker 308. The components of the hearing aid of FIG. 18 are conventional and well understood, except that D/A conversion system 306 has been modified in accordance with the present invention. In the preferred embodiment, D/A conversion system 306 is an over-sampling D/A conversion system such as that shown in FIG. 4, where demodulator 69 has been replaced with the demodulator of FIG. 5. Delta sigma modulator 204 may be any of the delta sigma modulators described in this application, but preferably is one of the corrected feedback delta sigma modulators shown in FIGS. 8–12. Duty cycle demodulator 208 is preferably as shown in FIG. 6.

While the exemplary preferred embodiments of the present invention are described herein with particularity, those skilled in the art will appreciate various changes, additions, and applications other than those specifically mentioned, which are within the spirit and scope of this invention.

What is claimed is:

1. In a delta sigma quantizer of at least second order including at least two accumulators having accumulator arithmetic elements for adding delayed output signals from the accumulator arithmetic elements to input signals provided to the accumulator arithmetic elements, said accumulators providing signals to a quantizer which provides output signals and feedback signals to the accumulators, said delta sigma modulator further including feedback arithmetic elements for adding said feedback signals to the accumulator input signals, the improvement comprising:

a single multiport adder operating in multiple phases comprises the accumulator arithmetic elements and the feedback arithmetic elements.

2. The delta sigma modulator of claim 1 wherein the single multiport adder comprises a three input adder operating in three phases.

3. The delta sigma modulator of claim 2 wherein the three phases comprise:

the first phase adds the input to the delta sigma modulator plus the previous output of the first stage plus the negative of the feedback;

the second phase adds the current output of the first stage plus the previous output of the second stage; and the third phase adds the current output of the first stage plus the current output of the second stage, and feeds the quantizer.

4. A digital to analog demodulator including the delta sigma quantizer of claim 1 and further comprising:

a duty cycle demodulator connected to the delta sigma modulator for converting the output of the quantizer into a higher rate lower resolution signal; and D/A means connected to the duty cycle demodulator for converting the higher rate lower resolution signal into an analog signal;

wherein the duty cycle demodulator includes means for formatting the higher rate medium resolution signal into a predetermined low transition rate format.

5. A digital to analog demodulator including the delta sigma quantizer of claim 3 and further comprising:

a duty cycle demodulator connected to the delta sigma for converting modulator the output of the quantizer into a higher rate lower resolution signal; and D/A means connected to the duty cycle demodulator for converting the higher rate lower resolution signal into an analog signal;

wherein the duty cycle demodulator includes means for formatting the higher rate medium resolution signal into a predetermined low transition rate format.

6. The digital to analog converter of claim 5, wherein the delta sigma modulator further includes:

means for selecting a correction factor to be applied to at least one of the feedback signals based upon the predetermined low transition rate format and the feedback signal; and means for applying the correction factor to at least one of the feedback loops.

7. A second order delta sigma quantizer comprising:

means for applying an input signal to the delta sigma quantizer;

a first accumulator comprising means for storing a previous value of said first accumulator's output, and means for adding at least one other input to the previous value of said first accumulator's output, to form said first accumulator's current output;

a second accumulator comprising means for storing a previous value of said second accumulator's output, and means for adding at least one other input to the previous value of said second accumulator's output, to form said second accumulator's current output;

an adder for adding at least two inputs to form an adder output;

a quantizer for quantizing the adder output to generate a standard feedback signal and an output signal; and correction means for receiving the standard feedback signal and generating a corrected feedback signal to account for nonlinear higher integrals of the output data patterns;

wherein the other inputs to the first accumulator comprise the standard feedback signal and the input signal, the other inputs to the second accumulator comprise the current output of the first accumulator and the corrected feedback signal, and the inputs to the adder comprise the current output of the first accumulator fed forward and the current output of the second accumulator.

8. The second order delta sigma quantizer of claim 7, further comprising:

dither means for providing a dither signal as an input to the adder.

9. A digital to analog (D/A) converter for converting a medium rate, high resolution digital signal into an analog signal, said converter comprising:

a delta sigma modulator of at least second order including at least two feedback loops carrying a feedback signal for converting the medium rate, high resolution digital signal into a medium rate, medium resolution digital signal;

a duty cycle demodulator connected to the delta sigma modulator for converting the medium rate, medium resolution digital signal into a high rate, low resolution digital signal; and D/A means connected to the duty cycle demodulator for converting the high rate, low resolution digital signal into the analog signal;

wherein the duty cycle demodulator includes means for formatting the high rate, low resolution digital signal into a predetermined low transition rate format; and wherein the delta sigma modulator includes:

means for selecting different correction factors to be applied to at least two of the feedback loops based upon the predetermined low transition rate format and the feedback signal; and means for applying different correction factors to at least two of the feedback loops.

10. The D/A converter of claim 9, wherein the duty cycle demodulator includes alternating means for alternating the predetermined low transition rate format between at least two different formats selected for successive outputs of the delta sigma modulator, for lowering the transition rate of the high rate low resolution signal further.

11. The D/A converter of claim 9, wherein the formatting means comprises:

means for determining a multiple bit value corresponding to each input value of the medium rate, medium resolution digital signal; and means for outputting the determined values as the high rate, low resolution digital signal.

12. The D/A converter of claim 11, wherein said determining means comprises:

means for storing a value corresponding each possible input value of the medium rate, medium resolution digital signal, said stored value representing said corresponding input value formatted in the predetermined low transition rate format; and lookup means responsive to each medium rate, medium resolution digital signal input for looking up the corresponding stored value.

13. The D/A converter of claim 12, wherein:

the determining means comprises a read-only-memory (ROM) said ROM outputting the looked up values in parallel; and the means for outputting comprises a parallel to serial converter connected to said ROM, said parallel to serial converter converting the parallel looked up values into the high rate, low resolution digital signal.

14. The D/A converter of claim 9, wherein the D/A means comprises a class D output stage for driving an output speaker.

15. The D/A converter of claim 9, implemented in an integrated circuit.

16. The D/A converter of claim 9, implemented to operate at 1.1 volts or lower.

17. A digital to analog (D/A) converter for converting a medium rate, high resolution digital signal into an analog signal, said converter comprising:

a delta sigma modulator of at least second order including at least two feedback loops carrying a feedback signal for converting the medium rate, high resolution digital signal into a medium rate, medium resolution digital signal;

a duty cycle demodulator connected to the delta sigma modulator for converting the medium rate, medium resolution digital signal into a high rate, low resolution digital signal; and D/A means connected to the duty cycle demodulator for converting the high rate, low resolution digital signal into the analog signal;

wherein the duty cycle demodulator includes means for formatting the high rate, low resolution digital signal into a predetermined low transition rate format; and wherein the delta sigma modulator includes:

means for selecting a correction factor to be applied to only one of the feedback loops based upon the predetermined low transition rate format and the feedback signal; and means for applying the correction factor to only one of the feedback loops.

18. The D/A converter of claim 17, wherein the duty cycle demodulator includes alternating means for alternating the predetermined low transition rate format between at least two different formats selected for successive outputs of the delta sigma modulator, for lowering the transition rate of the high rate low resolution signal further.

19. The D/A converter of claim 17, wherein the formatting means comprises:

means for determining a multiple bit value corresponding to each input value of the medium rate, medium resolution digital signal; and means for outputting the determined values as the high rate, low resolution digital signal.

20. The D/A converter of claim 19, wherein said determining means comprises:

means for storing a value corresponding each possible input value of the medium rate, medium resolution digital signal, said stored value representing said corresponding input value formatted in the predetermined low transition rate format; and lookup means responsive to each medium rate, medium resolution digital signal input for looking up the corresponding stored value.

21. The D/A converter of claim 20, wherein:

the determining means comprises a read-only-memory (ROM) said ROM outputting the looked up values in parallel; and the means for outputting comprises a parallel to serial converter connected to said ROM, said parallel to serial converter converting the parallel looked up values into the high rate, low resolution digital signal.

22. The D/A converter of claim 17, wherein the D/A means comprises a class D output stage for driving an output speaker.

23. The D/A converter of claim 17, implemented in an integrated circuit.

24. The D/A converter of claim 17, implemented to operate at 1.1 volts or lower.

25. A hearing aid, of the type including an audio receiver to receive ambient sound, an analog to digital (A/D) converter to convert the sound to a high resolution, low rate digital signal, digital processing circuitry to modify the quality of the high resolution, low rate digital signal, interpolator circuitry for converting the high resolution, low rate digital signal to a medium rate, high resolution signal, a digital to analog (D/A) converter for converting the modified high resolution, medium rate digital signal back into analog sound, wherein the improvement is an improved demodulator within the D/A converter, said demodulator comprising:

a delta sigma modulator of at least second order, having at least two feedback loops carrying a feedback signal, for converting the high resolution, medium rate digital signal into a medium rate, medium resolution digital signal; and a duty cycle demodulator connected to the delta sigma modulator for converting the medium rate, medium resolution digital signal into a high rate, low resolution digital signal;

wherein the duty cycle demodulator includes means for formatting the high rate, low resolution digital signal into a predetermined low transition rate format; and wherein said delta sigma modulator further includes:

means for selecting and applying two different correction factors to two of the feedback loops based upon the predetermined low transition rate format and the feedback signal.

26. A hearing aid, of the type including an audio receiver to receive ambient sound, an analog to digital (A/D) converter to convert the sound to a high resolution, low rate digital signal, digital processing circuitry to modify the quality of the high resolution, low rate digital signal, interpolator circuitry for converting the high resolution, low rate digital signal to a medium rate, high resolution signal, a digital to analog (D/A) converter for converting the modified high resolution, medium rate digital signal back into analog sound, wherein the improvement is an improved demodulator within the D/A converter, said demodulator comprising:

a delta sigma modulator of at least second order, having at least two feedback loops carrying a feedback signal, for converting the high resolution, medium rate digital signal into a medium rate, medium resolution digital signal; and a duty cycle demodulator connected to the delta sigma modulator for converting the medium rate, medium resolution digital signal into a high rate, low resolution digital signal;

wherein the duty cycle demodulator includes means for formatting the high rate, low resolution digital signal into a predetermined low transition rate format; and wherein said delta sigma modulator further includes:

means for selecting and applying a correction factor to only one of the feedback loops based upon the predetermined low transition rate format and the feedback signal.

* * * * *

UNITED STATES PATENT AND TRADEMARK OFFICE
CERTIFICATE OF CORRECTION

PATENT NO. : 5,815,102            Page 1 of 2
DATED : September 29, 1998
INVENTOR(S) : Melanson It is certified that error appears in the above-identified patent and that said Letters Patent is hereby corrected as shown below:

Column 2, line 10, delete "by" and insert --be--.

Column 5, line 7, delete ";" and insert --,--.

Column 6, line 66, delete "lookup" and insert --look up--.

Column 7, line 1, insert --93-- between 'block' and 'could'.

UNITED STATES PATENT AND TRADEMARK OFFICE
CERTIFICATE OF CORRECTION

PATENT NO. : 5,815,102
DATED : September 29, 1998
INVENTOR(S) : Melanson

It is certified that error appears in the above-identified patent and that said Letters Patent is hereby corrected as shown below:

Column 9, line 58, delete "essential" and insert --essentially--.

Column 11, lines 39 and 40, delete "for converting modulator" and insert --modulator for converting--.

Signed and Sealed this

Fourth Day of May, 1999

Attest:

Attesting Officer

Q. TODD DICKINSON

Acting Commissioner of Patents and Trademarks